(12) United States Patent
Escuti et al.

(10) Patent No.: US 7,006,747 B2
(45) Date of Patent: Feb. 28, 2006

(54) OPTICAL DEVICES INCORPORATING PHOTO REACTIVE POLYMERS

(75) Inventors: Michael J. Escuti, Best (NL); Gregory P. Crawford, Providence, RI (US); Richard C. Allen, Lilydale, MN (US)

(73) Assignees: 3M Innovative Properties Company, St. Paul, MN (US); Brown University, Providence, RI (US)

( * ) Notice: Subject to any disclaimer, the term of this patent is extended or adjusted under 35 U.S.C. 154(b) by 315 days.

(21) Appl. No.: 10/346,644

(22) Filed: Jan. 17, 2003

(65) Prior Publication Data

US 2004/0141706 A1    Jul. 22, 2004

(51) Int. Cl.
G02B 6/10    (2006.01)

(52) U.S. Cl. .................. 385/132; 385/123; 385/120; 385/901; 349/159; 372/48

(58) Field of Classification Search .............. 385/115, 385/120, 123, 130, 132, 141, 147, 901; 349/84, 349/158, 159; 372/44, 45, 48; 438/33, 43; 216/2, 33; 257/84; 430/321
See application file for complete search history.

(56) References Cited

U.S. PATENT DOCUMENTS 4,496,216 A    1/1985    Cowan
4,839,250 A    6/1989    Cowan (Continued)

FOREIGN PATENT DOCUMENTS

| EP | 0 525 755 A1 | 2/1993 |
|---|---|---|
| EP | 0 747 894 A2 | 12/1996 |
| EP | 0 867 749 A2 | 9/1998 |
| WO | WO 95/01584 | 1/1995 |
| WO | WO 9801791 A1 | 1/1998 |
| WO | WO 01/96962 A2 | 12/2001 |

OTHER PUBLICATIONS

Berger, et al., "Photonic band gaps and holography", *J. Appl. Phys.* vol. 82, No. (1), (Jul. 1, 1997), pp. 60–64.

(Continued)

*Primary Examiner*—Phan T. H. Palmer

(57) ABSTRACT

A method for forming a display device including generating a face plate element by providing a first substrate with a photoactive resin thereon and exposing the photoactive resin to a light interference pattern formed by three collimated and coherent light sources, resulting in columnar features. A display device including an optical display element and a polymer face plate that receives or directs light to the optical display element. The face plate includes columnar areas where an index of refraction of the columnar areas is different from the index of refraction of a cladding area surrounding the columnar areas. The columnar areas are formed by exposure of a photoactive resin to a light interference pattern formed by three collimated and coherent light sources. A method of manufacturing a wave guide including providing a first substrate with a photoactive resin thereon and creating a wave guide channel in a wave guide template. The wave guide channel is filled with a liquid crystal material that is exposed to a light grating to create a variation in an index of refraction of the liquid crystal material in the wave guide channel.

24 Claims, 17 Drawing Sheets

U.S. PATENT DOCUMENTS

| | | | |
|---|---|---|---|
| 5,442,467 | A | 8/1995 | Silverstein et al. |
| 5,563,411 | A | 10/1996 | Hara et al. |
| 5,726,730 | A | 3/1998 | Crawford et al. |
| 5,728,492 | A | 3/1998 | Kawata |
| 5,751,390 | A | 5/1998 | Crawford et al. |
| 5,798,194 | A | 8/1998 | Kawata et al. |
| 5,867,240 | A | 2/1999 | Crawford et al. |
| 5,876,881 | A | 3/1999 | Kawata |
| 5,928,819 | A | 7/1999 | Crawford et al. |
| 5,959,711 | A * | 9/1999 | Silverstein et al. ......... 349/159 |
| 5,969,362 | A | 10/1999 | Kawata |
| 6,038,015 | A | 3/2000 | Kawata |
| 6,087,667 | A | 7/2000 | Nakasuji et al. |
| 6,124,718 | A | 9/2000 | Kawata |
| 6,140,021 | A | 10/2000 | Kawata |
| 6,398,981 | B1 | 6/2002 | Galstian et al. |
| 2001/0035991 | A1 | 11/2001 | Hobbs et al. |

OTHER PUBLICATIONS

Campbell, et al., "Fabrication of photonic crystals for the visible spectrum by holographic lithography", *Nature*, vol. 404 *2000 Macmillian Magazines Ltd.*, (Apr. 2, 2000), pp. 53–56.

Shoji, et al., "Optically–induced growth of fiber patterns into a photopolymerizable resin", *Applied Physics Letters* vol. 75, No. 5, (Aug. 2, 1999), pp. 737–739.

Shoji, et al., "Photofabrication of three–dimensional photonic crystals by multibeam laser interference into a photopolymerizable resin", *Applied Physics Letters* vol. 76, No. 19, (May 8, 2000), pp. 2668–2670.

Tuberfield, "Photonic Crystals Made by holographic Lithography", *MRS Bulletin* (Aug. 2001), pp. 632–636.

Wolf, et al., "Silicon Processing for the VLSI Era vol. 1 Process Technology", Lattice Press, Sunset Beach, CA (1986), Title page, Disclaimer, and pp. 407–421.

Yoshino, et al., "Temperature tuning of the stop band in transmission spectra of liquid–crystal infilitrated snthetic opal as tunable photonic crystal", *Applied Physics Letters* vol. 75, No. 7, (Aug. 16, 1999), pp. 932–934.

* cited by examiner

OPTICAL DEVICES INCORPORATING PHOTO REACTIVE POLYMERS

FIELD OF THE INVENTION

This invention relates generally to face plates for optical devices and more particularly concerns methods in which photopolymerizable polymers can be utilized for fabrication of face plates and other optical devices.

BACKGROUND

Fiber optic face plates (FOFPs) are useful for the construction of liquid crystal displays with improved viewing angles. For example, U.S. Pat. No. 5,959,711 describes a benefit with the addition of one or more FOFP layers by reducing the undesirable variations in luminance, contrast ratio, and chromaticity as the display is viewed from different orientations. The viewing-angle in most LCD modes is limited due to a decrease in contrast and the presence of grayscale inversion as the display is viewed at increasingly oblique angles. As almost all commercial LCDs operate on the principle of affecting the polarization-state of light passing through them, the anisotropy in transmission-characteristics arises because the imposed phase-shift depends on the direction of propagation through the film. There are many approaches to overcome this deficiency, from the addition of passive birefringent films to designs of the pixel structure and display mode. FOFP layers in an LCD can augment or even replace many of these approaches, by azimuthally-averaging the viewing-cone.

In one embodiment, a FOFP can be located between a top polarizer and a liquid crystal layer at the front of a display device. The most common construction of a FOFP includes an array of individual glass or polymer optical fibers that are fused together with an interstitial cladding material and then cut and polished to a desired thickness to form a plate. As is well known in the art, the relevant principle of operation of the FOFP in this context is that light incident on the fiber cores at or below some acceptance angle ($\theta_{Max}$IN) will be transmitted through each fiber core by the process of total internal reflection (TIR) at the core-cladding interface. Known as a guided ray, no losses occur and the polar angle of the ray is preserved within the core, while the azimuthal angle of the ray is determined by the position of the entering ray and the number of reflections. As shown in FIG. 1, the consequence of this rotation is that the optical fiber 10 averages about the azimuthal position all of the incoming light entering at a given polar angle such that the output consists of a hollow exit cone 22 with a solid angle of twice the maximum entrance angle. In FIG. 1, because both illustrated incoming light rays 24, 26 enter the optical fiber 10 at an angle $\theta_{Max}$, the solid angle of the hollow exit cone 22 is $2\theta_{Max}$. As the light emerging as a hollow exit cone 22 consists of an average about the azimuthal position, the transmitted light intensity is substantially equal at all azimuthal angles. It is this property of azimuthal averaging that enables FOFPs to produce symmetrical viewing characteristics over wide angles when coupled to a LCD with inherent anisotropies in luminance and contrast.

However, light incident above $\theta_{Max}$IN will not undergo total internal reflection, and will instead leak partially out into the cladding at every core-cladding interface. These unguided leakage rays and any light incident on the cladding itself continue to propagate through the array with no predictable azimuthal and polar angles, and are therefore scattered.

The angle $\theta_{Max}$IN and the angle the light beam will exit the optical fiber 10, $\theta_{Max}$OUT, will be the same where the relative index of refraction of the material surrounding the optical fiber 10 at the entrance plane and exit plane surfaces is the same. These quantities may differ where the material surrounding the entrance and exit plane surfaces have a different indices. Three features of the FOFP determine $\theta_{Max}$IN and $\theta_{Max}$OUT: the index of refraction of the core, of the cladding, and of the boundary material at the entrance or exit of the array. The basic relationship between these three indices and the angles is described in the following two equations, which are well known in the art:

$$NA = N_0 \sin \theta_{max} = \sqrt{N^2_{fib} - N^2_{clad}}$$

$$\theta_{max} = \arcsin\left(\frac{1}{N_0}\sqrt{N^2_{fib} - N^2_{clad}}\right)$$

where:
NA=numerical aperture of FOFP
$\theta_{max}$=FOFP maximum solid angle of acceptance or exit
$N_0$=refractive index of surrounding material or boundary
$N_{fib}$=refractive index of optical fiber
$N_{clad}$=refractive index of fiber cladding A high NA on the input face of the FOFP, through the choice of a low $N_0$ at the input (such as air) or a large core-cladding index contrast, will lead to a wide acceptance angle. Similarly, a high NA at the output face of the FOFP will lead to a wide exit angle, which in this case is achieved by considering the $N_0$ at the output. Conversely, a restricted $\theta_{Max}$IN or $\theta_{Max}$OUT results when a small core-cladding index contrast is chosen or when a high index material is used as the surrounding material, such as plastic, polyamide, or optical glass.

A FOFP could also be located at the rear of a display device, especially a display device with a rear illumination source. For example, a rear FOFP could be positioned between a diffuser and a liquid crystal cell. The rear FOFP may include an input face, facing and adjacent to the diffuser, which has a high $\theta_{Max}$IN resulting in a relatively wide light acceptance angle. An output face of the rear FOFP is opposite the input face, where the output face provides a low $\theta_{Max}$OUT. Therefore the FOFP has a relatively narrow light exit or output angle. The rear FOFP provides increased collection of light from the rear illumination source, thereby providing an improvement in the luminous efficiency of the LCD.

FIG. 2 illustrates a top view of a FOFP 28 made of an array of individual optical fibers that are fused together with an interstitial cladding material and then cut and polished to a desired thickness to form a plate. The core 12 and cladding material 14 can be seen on the surface of the FOFP 28. FIG. 3 illustrates a closer view of a portion of the FOFP 28 of FIG. 2.

SUMMARY OF THE INVENTION

One embodiment of the invention is a method for forming a display device including generating a face plate element by providing a first substrate with a photoactive resin thereon and exposing the photoactive resin to a light interference pattern formed by three collimated and coherent light sources. The light interference pattern generates first light regions and second dark regions in the photoactive resin. The photoactive resin of the first light region is altered by exposure to light of the light interference pattern and either of the first regions or the second regions form columnar features. The face plate is combined with an optical display element to form a display device. The face plate receives or directs light to the optical display element.

Another embodiment of the invention is a display device including an optical display element and a polymer face plate that receives or directs light to the optical display element. The face plate includes columnar areas where an index of refraction of the columnar areas is different from the index of refraction of a cladding area surrounding the columnar areas. The columnar areas are formed by exposure of a photoactive resin to a light interference pattern formed by three collimated and coherent light sources. The light interference pattern includes first light regions and second dark regions in the photoactive resin. The photoactive resin of the first light region is altered by exposure to light and either the first regions or the second regions form the columnar areas.

Another embodiment of the invention is a method of manufacturing a wave guide including providing a first substrate with a photoactive resin thereon and creating a wave guide channel in a wave guide template. The photoactive resin is exposed to a light pattern having a first light region and a second dark region. The photoactive resin of either the first or second region is altered to be solidified to form the wave guide template while the photoactive resin of either the first or second region is soluble. The photoactive resin that is soluble is dissolved to define the wave guide channel in the wave guide template. Then the wave guide channel is filled with a liquid crystal material. The liquid crystal material is exposed to a light grating to create a variation in an index of refraction of the liquid crystal material in the wave guide channel.

BRIEF DESCRIPTION OF THE DRAWINGS

The invention may be more completely understood by considering the detailed description of various embodiments of the invention that follows in connection with the accompanying drawings.

Figure 1:
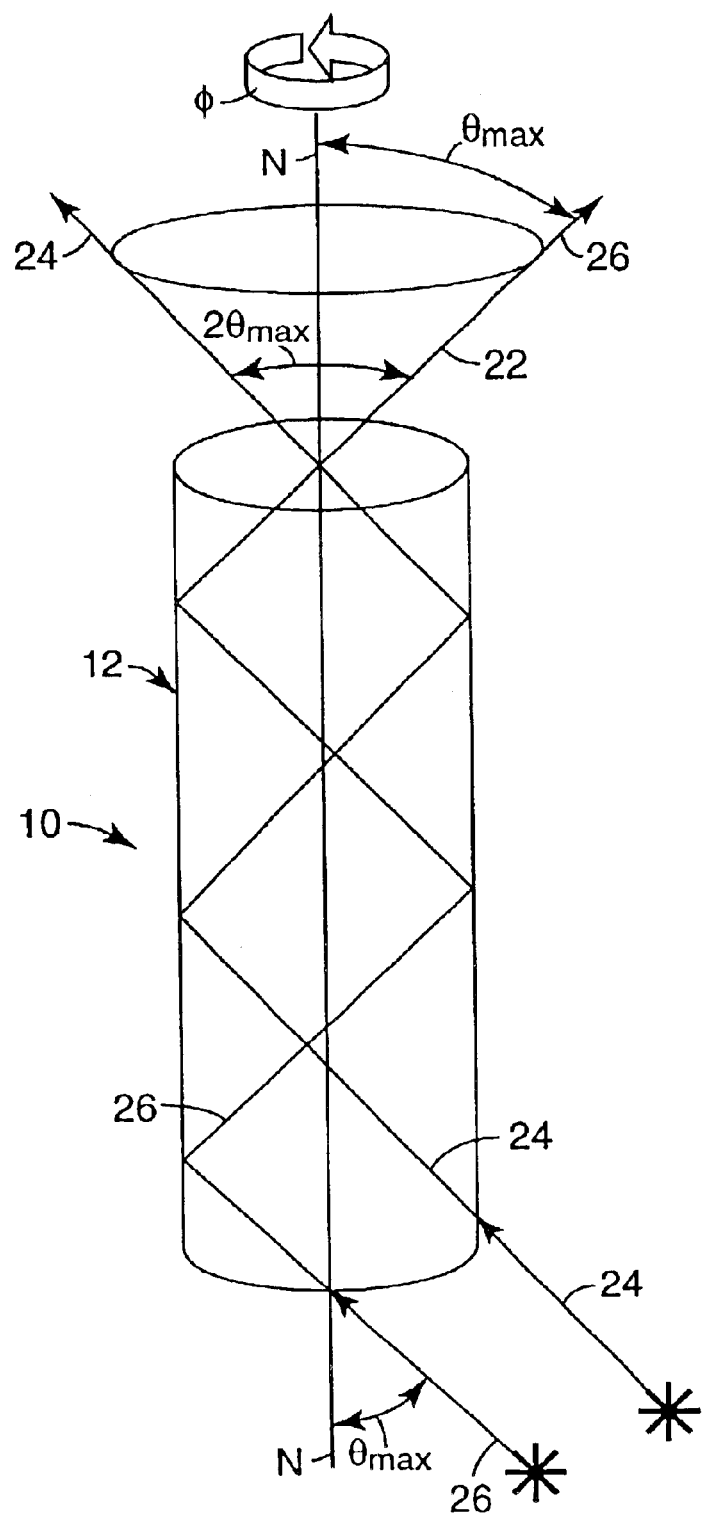
FIG. 1 is a side view of an optic fiber illustrating azimuthal averaging.
Figure 2:
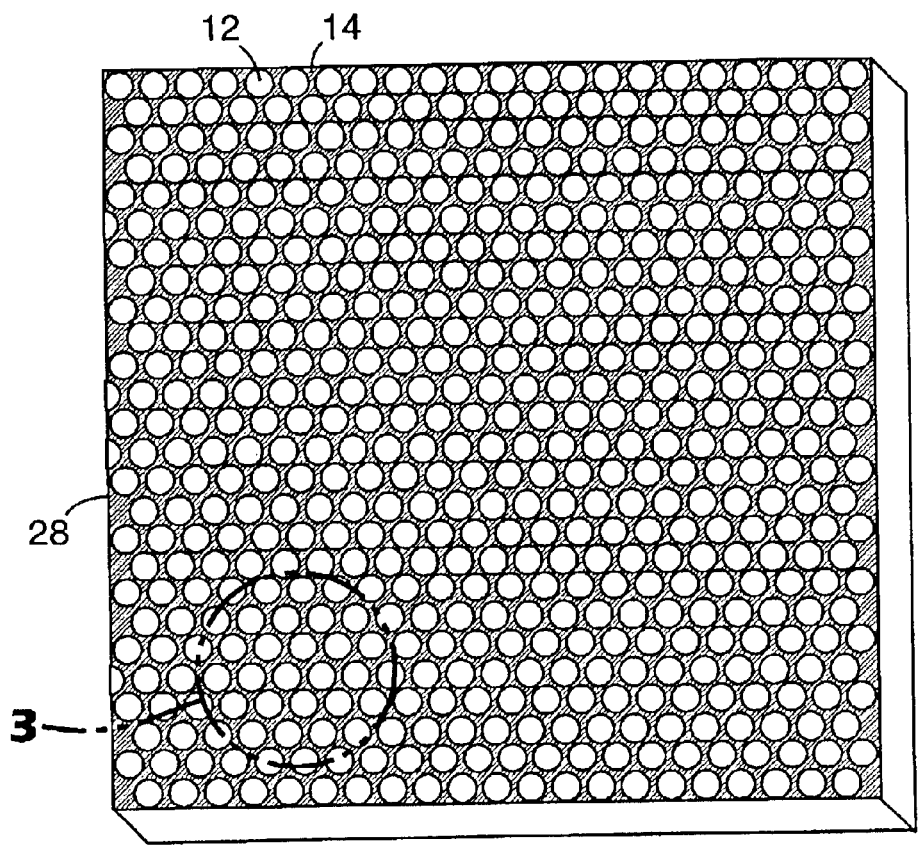
FIG. 2 is a top view of a prior art FOFP.
Figure 3:
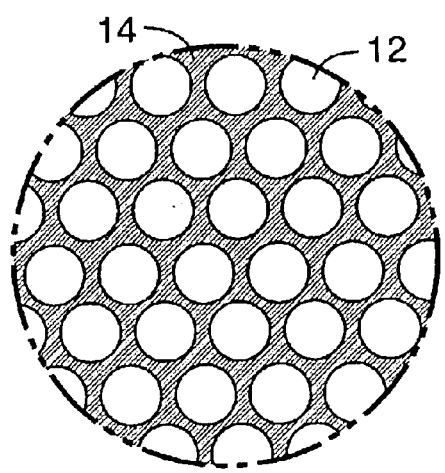
FIG. 3 is an expanded view of a portion of FIG. 2.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENTS

The present invention is believed to be applicable to a variety of devices and arrangements that may be used as or with optical devices. The invention has been found to be particularly advantageous in application environments where photoreactive polymers are used to form optical devices, particularly to form face plates. While the present invention is not so limited, an appreciation of various aspects of the invention is best gained through a discussion of various application examples operating in such an environment.

Many prior art FOFPs are constructed of extruded bundles of optical fiber cores, encased in a rigid cladding. The labor-intensive fabrication of such FOFPs for LCDs with moderate to large display diagonals, such as 12 inches to greater than 21 inches, is very expensive, and the additional weight and thickness is undesirable for most applications. Alternate fabrication methods have been disclosed, such as those discussed in U.S. Pat. No. 5,726,730 and U.S. Pat. No. 5,928,819, but as these films are sensitive to the polarization of light passing thought them, they do not replicate the optical effect from glass-based FOFPs. Furthermore, their fabrication requires complex processes involving high electric fields, patterned electrodes, and surface alignment layers.

Any plate that has columnar features approximately in the direction of light propagation that are capable of total internal reflection, a controllable NA at input and output surfaces and a sufficiently large core aspect ratio, will exhibit rotational azimuthal averaging and translation of the object plane from a back surface to the front surface and is therefore an optical equivalent of a FOFP. These essential optical properties can be imparted to a range of materials. A variety of monomer or polymer networks containing adjacent areas with differing refractive indices can result in a substrate containing a plurality of cylindrical features whose boundaries are defined by a discontinuity of refractive indices. The index of refraction within the cylindrical features may be greater than the index of refraction at the boundaries and external to the cylindrical features. Alternatively, the index of refraction within the cylindrical features may be less than the index of refraction at the boundaries and external to the cylindrical features.

Photoreactive polymers may be used to form structures with the optical features of an FOFP. Either holographic or lithographic techniques can be used to create the desired structure of the FOFP using photoreactive polymers, as will be described herein. The terms holographic and lithographic describe how the light is structured.

In either type of technique, creating a FOFP involves starting with a homogeneous thin film of a photoresist. A photoresist is typically an organic photosensitive material. Either a negative or positive photoresist may be used. Negative photoresists are materials that polymerize or crosslink or both due to the action of light. In positive photoresists, the molecules have a photoreaction upon exposure to light resulting in molecules that are soluble in an appropriate developer solution. Photoresist materials are well known in the art, and are described, for example, in Stanley Wolf & Richard Tauber, "Silicon Processing for the VLSI Era," Volume 1 (Lattice Press, 1986).

One example of a photoreactive material that can be used to construct an FOFP equivalent is a negative photoresist commercially available as SU-8 and manufactured by Micro-Chem Inc. of Santa Clara, Calif. Polymerization of SU-8 and many other photoresist materials involves steps often including substrate cleaning and preparation, spin-casting, pre-exposure baking to remove excess solvent, exposing to an appropriate light source, post-exposure baking, and developing to remove unreacted molecules.

The superposition of coherent monochromatic electromagnetic waves leads to a spatial variation of the light intensity of the resulting spatial pattern. This phenomenon is called interference, and can result in maxima of light intensity that exceed the sum of the beam intensities and minima as low as zero. A photosensitive polymer can capture the spatial interference pattern. Examples of photosensitive polymers are photoresists (positive and negative) and holographic emulsions.

Figure 4:
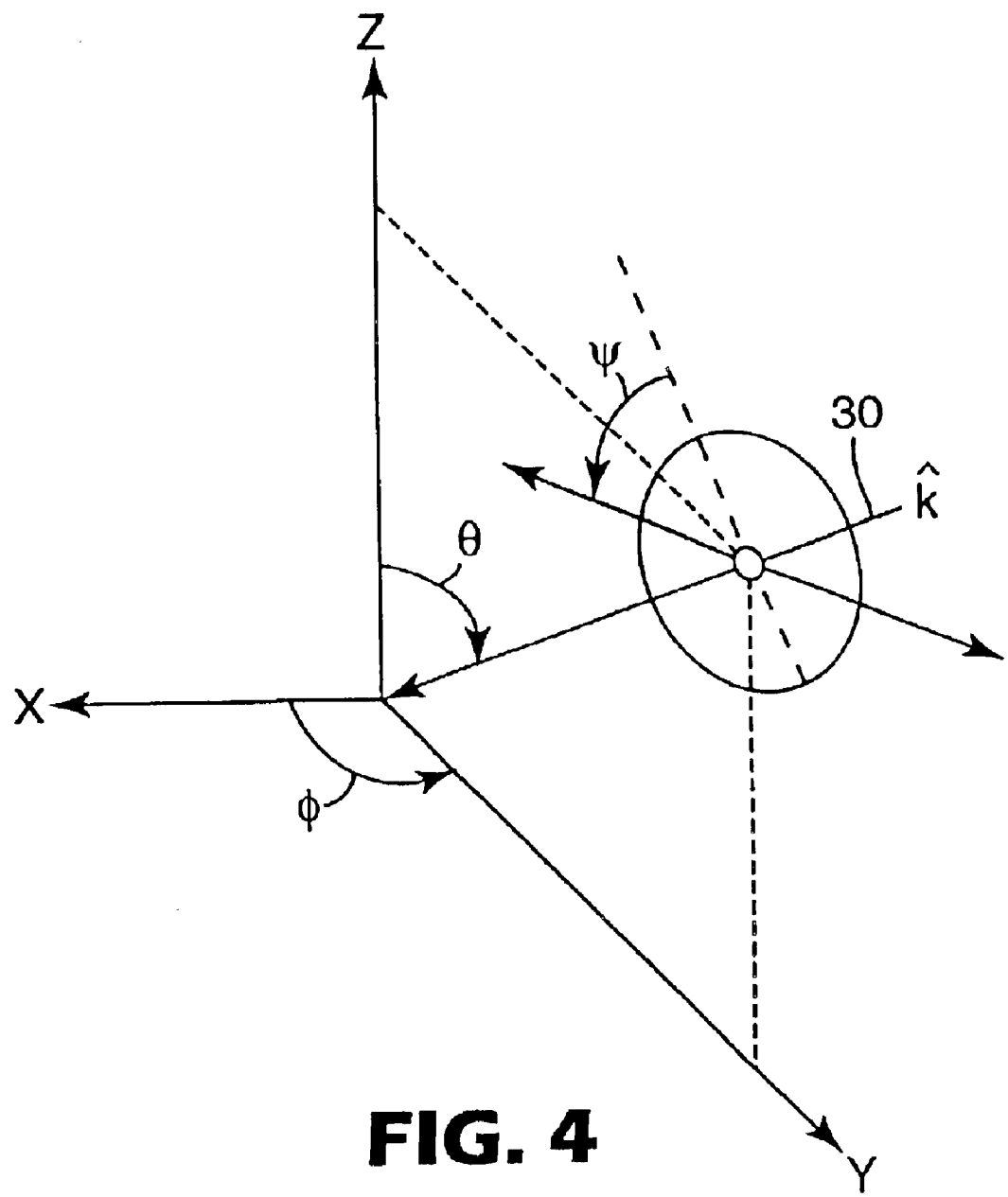
FIG. 4 illustrates the convention used herein to describe the propagation of plane waves.

The geometry for this discussion of the interfering wave vectors is illustrated in FIG. 4. FIG. 4 shows a wave vector 30 on a coordinate system. When two or more plane waves are distributed along the azimuth of a particular direction, for example the Z-axis, it is natural to define the propagation vectors in terms of spherical coordinates referenced to that axis. Therefore the wave vector 30 of a propagating plane wave can be fully described by a magnitude k, a polar angle $\theta$ measured from the Z-axis, and an azimuthal angle $\phi$ measured from +X-axis. The polarization angle $\psi$ is measured with respect to the plane containing both k and the Z-axis, where the convention for positive $\psi$ is shown in FIG. 4. In FIG. 4, k is in the Y-Z plane, so $\phi$ is 90°. Two special cases well known in the art are seen in this notation: $\psi=90°$ is often known as s- or TE-polarization, and $\psi=0°$ is known as p- or TM-polarization. It is useful to note that where $m_0$ is the number of interfering beams that are involved, and the interfering beams are evenly distributed along the azimuth for a particular direction, the azimuthal separation between each beam is found by $\phi_0=360°/m_0$. Where three interfering beams are involved, the azimuthal separation between each beam is 120°.

Where several coherent plane waves are superimposed, the volumetric interference can be computed. The total irradiance I(r) within a material of index n, dielectric permittivity $\epsilon$, and speed of light v=c/n, is proportional to the time-average of the squared magnitude of the total electric field: $I(r)=\epsilon \times v(E_{TOT}^2(r,t))_T$.

The total electric field is composed of N superimposed plane waves, where $E_m(r)=A_m \exp(ik\cdot r)$ is the complex amplitude of the mth plane wave. In an effort to clarify notation, we note that total electric field $E_{TOT}(r,t)$ is a real-valued vector that varies in time and space, the phasor-notation electric field $E_m(r)$ are complex-valued vectors that vary in space, and the plane wave amplitude-polarization vectors $A_m$ are potentially complex-valued constants. This is summarized by the following:

$$E_{TOT}(r, t) = R\{E(r) \exp(-i\omega t)\} = \frac{1}{2}\sum_{m=1}^{N}\left[E_m(r) \exp(-i\omega t) + E_m^*(r) \exp(i\omega t)\right].$$

As the electric field is a sinusoidal function in time, it can be shown that the time average becomes $$\langle E_{TOT}^2(r, t)\rangle_T = \frac{1}{2}E(r)\cdot E^*(r).$$

Furthermore, the product $\epsilon v$ can be expressed in terms of the intrinsic impedance of free space, such that the irradiance can be rewritten as the following:

$$I(r) = \frac{n}{2\eta_0}\sum_{l=1}^{N}\sum_{m=1}^{N} E_l \cdot E_m^* \exp\left(i(k_l - k_m)\cdot r\right)$$

The irradiance within a volume can therefore be found if the wave vectors, polarizations, and phase relationships for each interfering plane wave are known. While it is possible to work with the vector quantities directly ($k=[k_x, k_y, k_z]^T$ and $E=[E_x, E_y, E_z]^T$), it is most intuitive for the present discussion to use spherical coordinates, as illustrated in FIG. 4: $k_m=[k_m\ \phi_m\ \theta_m]^T$. Therefore, the wave vectors $k_m$ of monochromatic plane waves are fully described by a magnitude $k_m=2\pi/\lambda$, an azimuthal angle $\phi_m$ measured from the +X-axis, and a polar angle $\theta_m$ measured from the +Z-axis.

Figure 6:
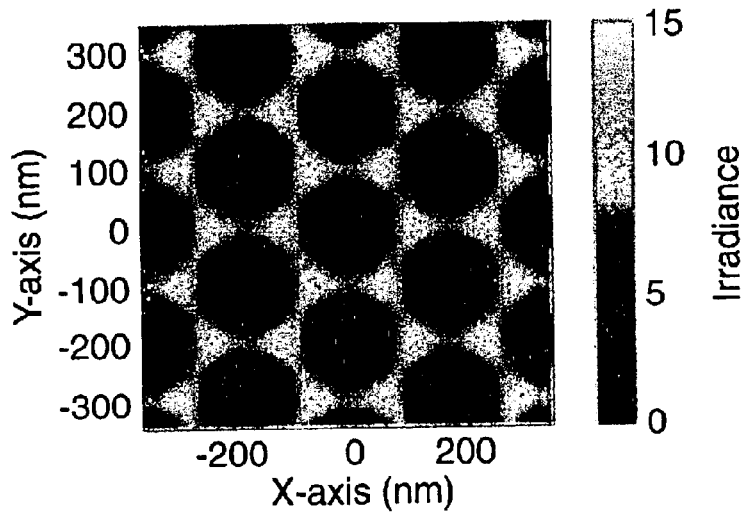
Figure 12:
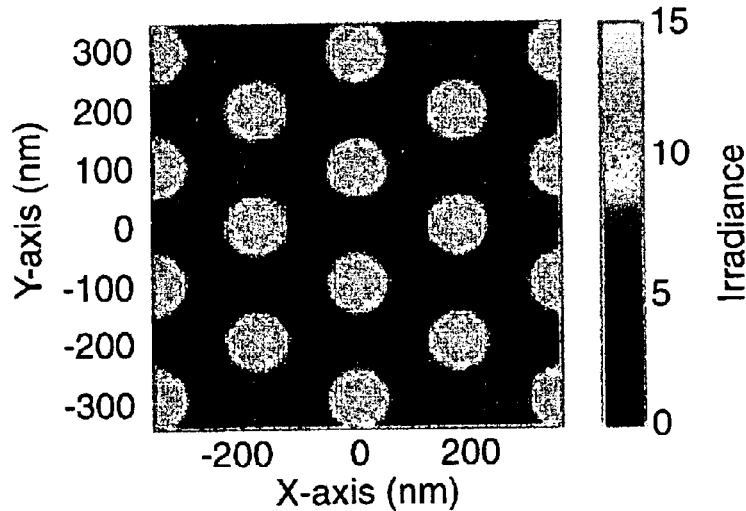

A spatial interference pattern such as those shown in FIGS. 6 and 12 can be used to create FOFP features in a photoreactive polymer, such as a positive or negative photoresist.

Figure 5:
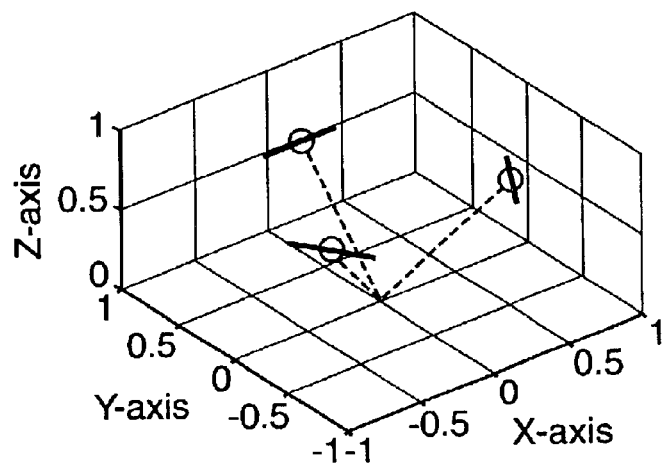
FIGS. 5–7 illustrate the vectors, polarization states, and irradiance along the X and Y axes for three coincident S-polarized coherent plane waves with $\theta=45°$. The six-fold symmetry of the triangular array is shown.
Figure 7A:
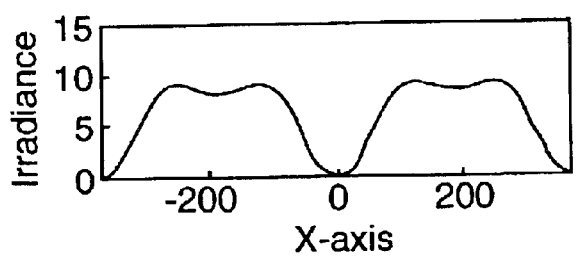
Figure 7B:
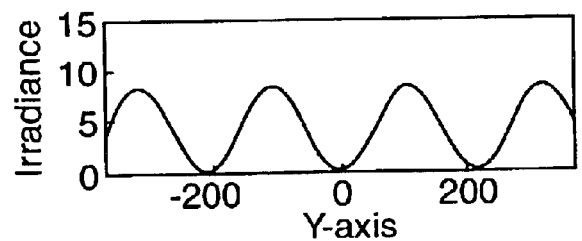
Figure 8:
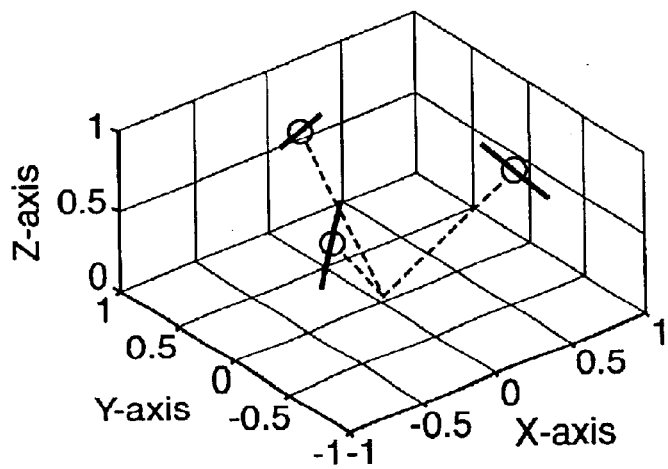
FIGS. 8–10 illustrate the vectors, polarization states, and irradiance along the X and Y axes for three coincident P-polarized coherent plane waves with $\theta=45°$. This pattern is something of an inversion of the case shown in FIGS. 5–7.
Figure 9:
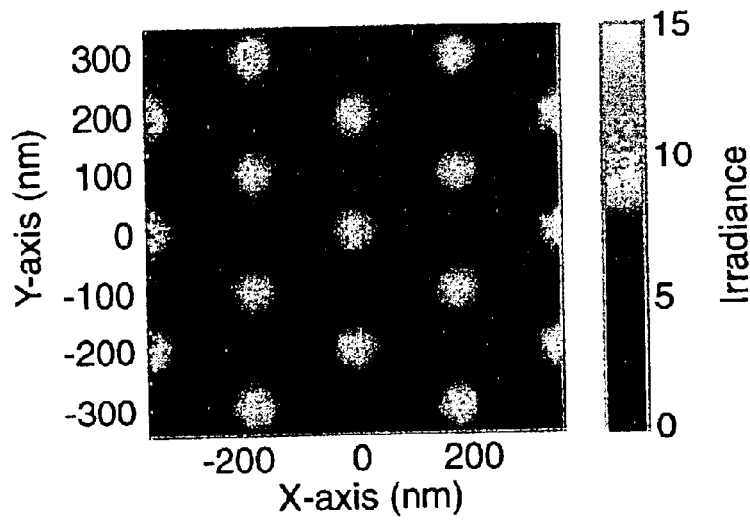
Figure 10A:
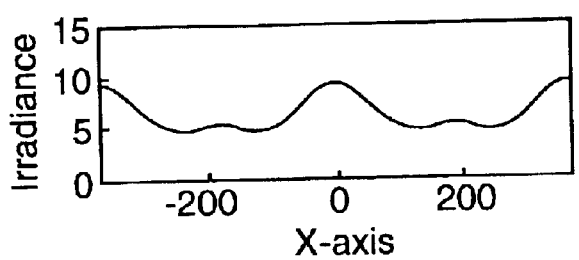
Figure 10B:
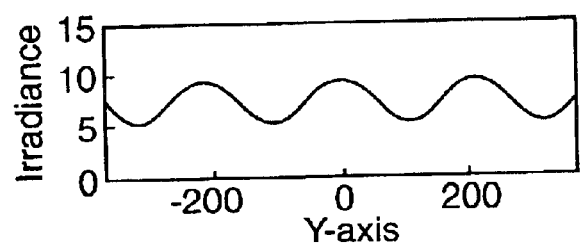
Figure 11:
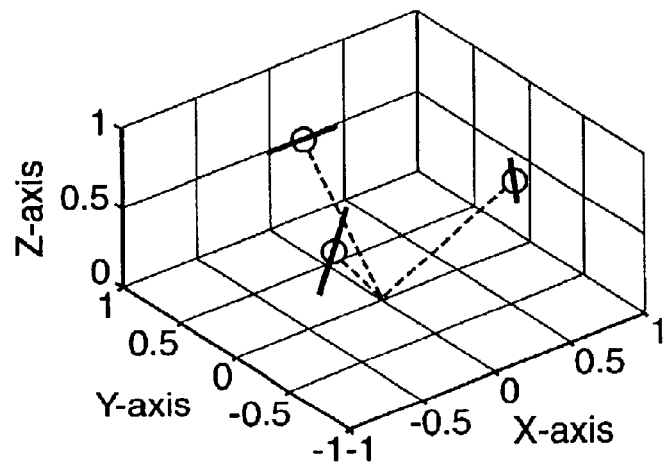
FIGS. 11–13 illustrate the vectors, polarization states, and irradiance along the X and Y axes for three coincident coherent plane with $\theta=45°$ and polarizations $\{96°, 178°, 86°\}$. This case is similar to the case shown in FIGS. 8–10, but the difference between the maximum and minimum irradiance is greater.
Figure 13A:
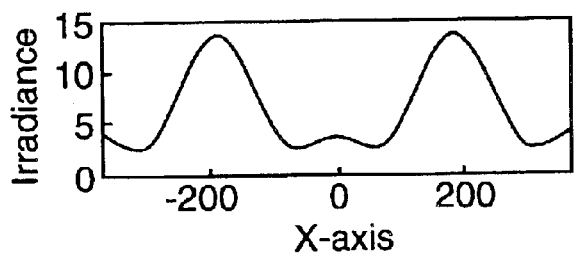
Figure 13B:
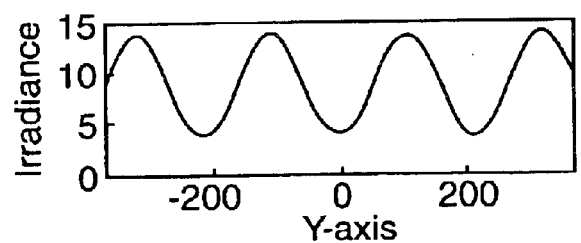

FIGS. 5–7 illustrates the vectors, polarization states, and irradiance, respectively, along the X and Y axes for three coincident S-polarized coherent plane waves with $\theta=45°$. The six-fold symmetry of the triangular array is shown. FIGS. 8–10 illustrate the vectors, polarization states, and irradiance along the X and Y axes for three coincident P-polarized coherent plane waves with $\theta=45°$. This pattern is something of an inversion of the case shown in FIGS. 5–7. FIGS. 11–13 illustrate the vectors, polarization states, and irradiance along the X and Y axes for three coincident coherent plane with $\theta=45°$ and polarizations {96°, 178°, 86°}. This case is similar to the case shown in FIGS. 6–8, but the difference between the maximum and minimum irradiance is greater.

Figure 14:
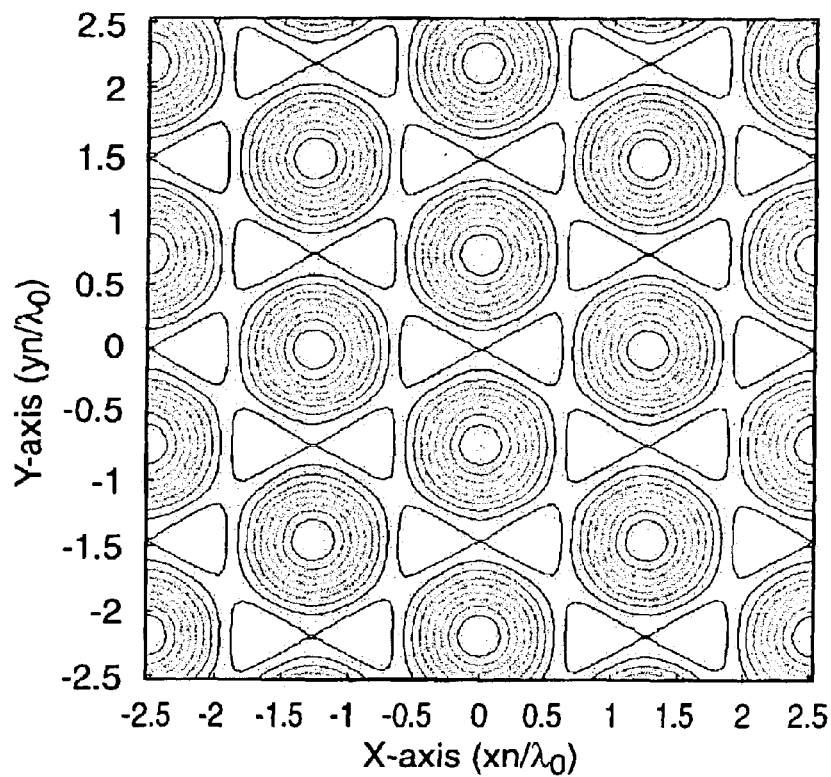
FIGS. 14–15 plot the intensity on the x- and y-axis of the irradiation pattern on FIG. 12.
Figure 15:
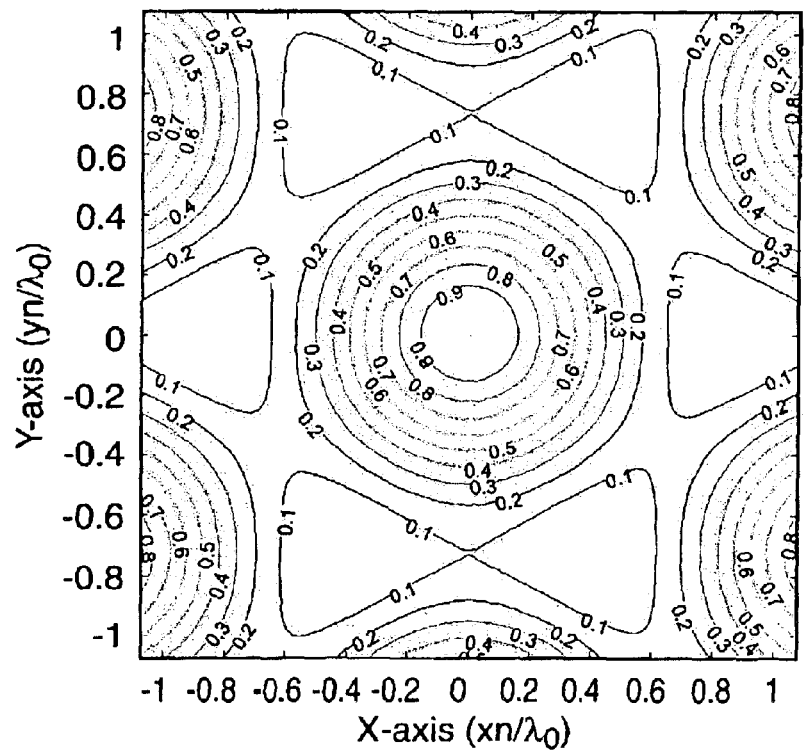
Figure 16:
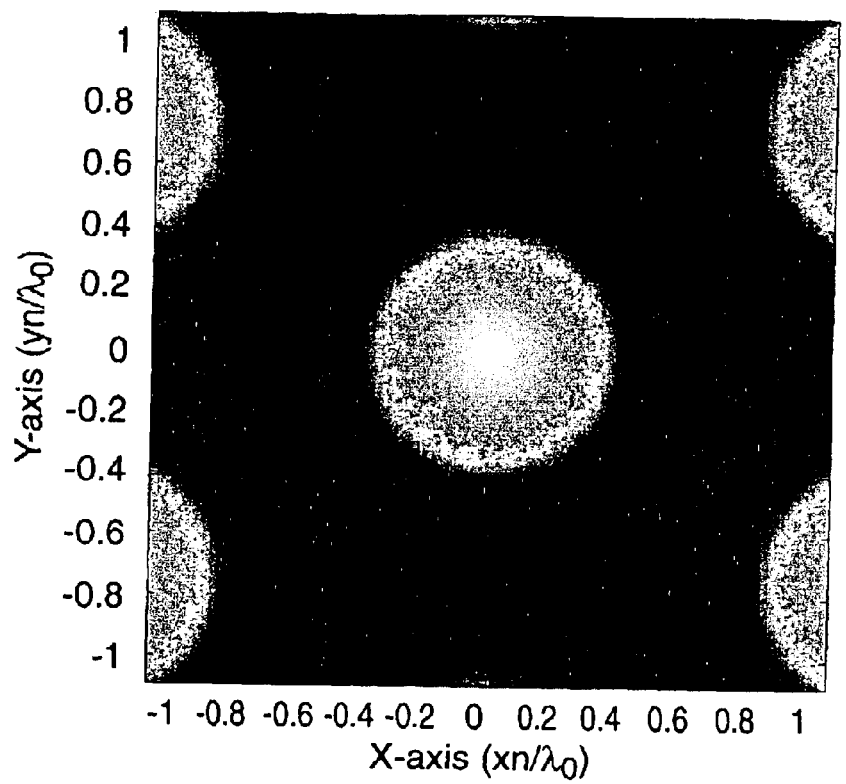
FIG. 16 provides a more detailed view of the interference pattern of FIG. 12.
Figure 17:
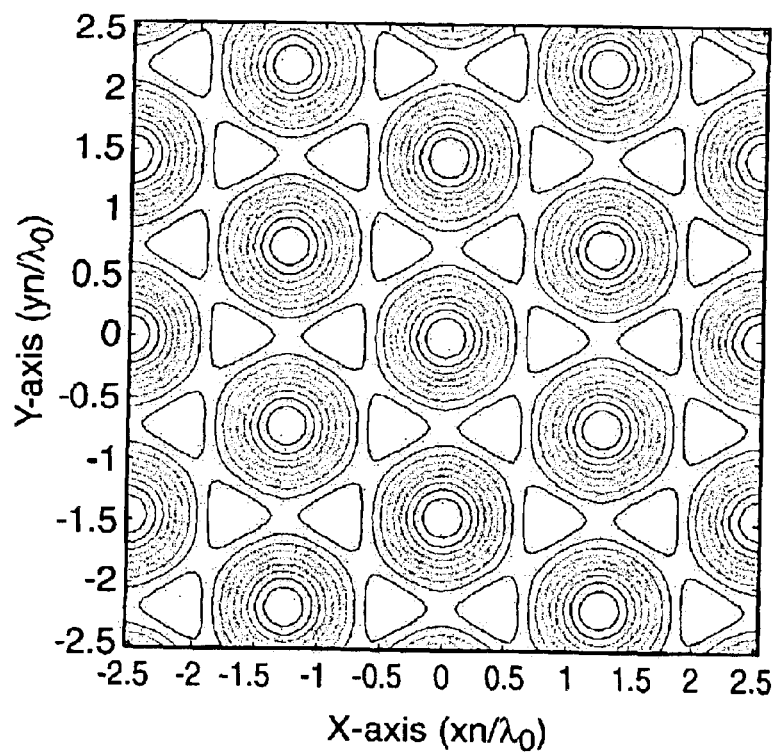
FIGS. 17–18 plot the intensity on the x- and y-axis of the irradiation pattern on FIG. 6.
Figure 18:
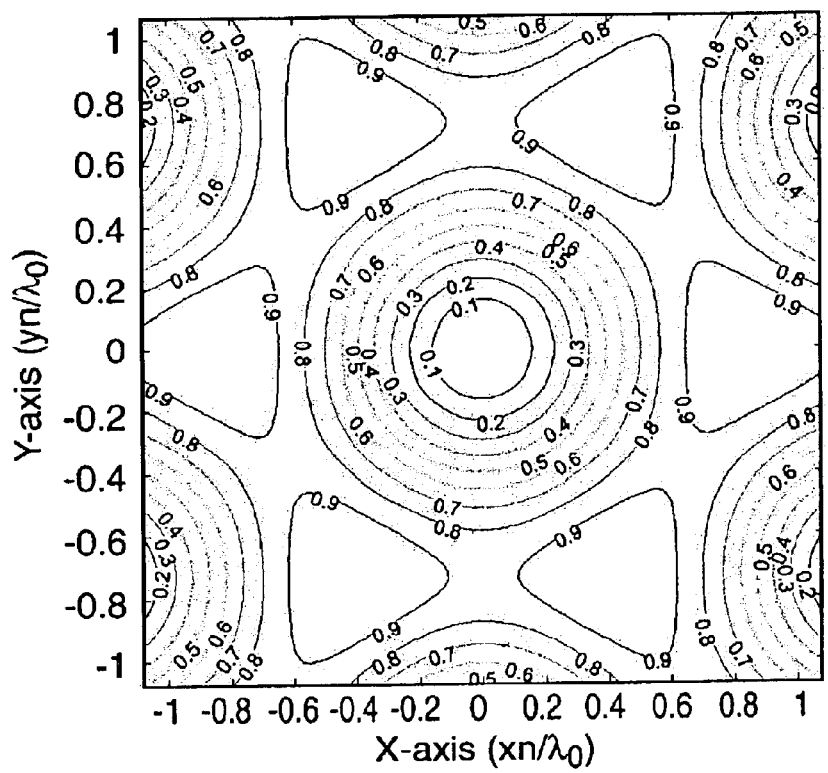
Figure 19:
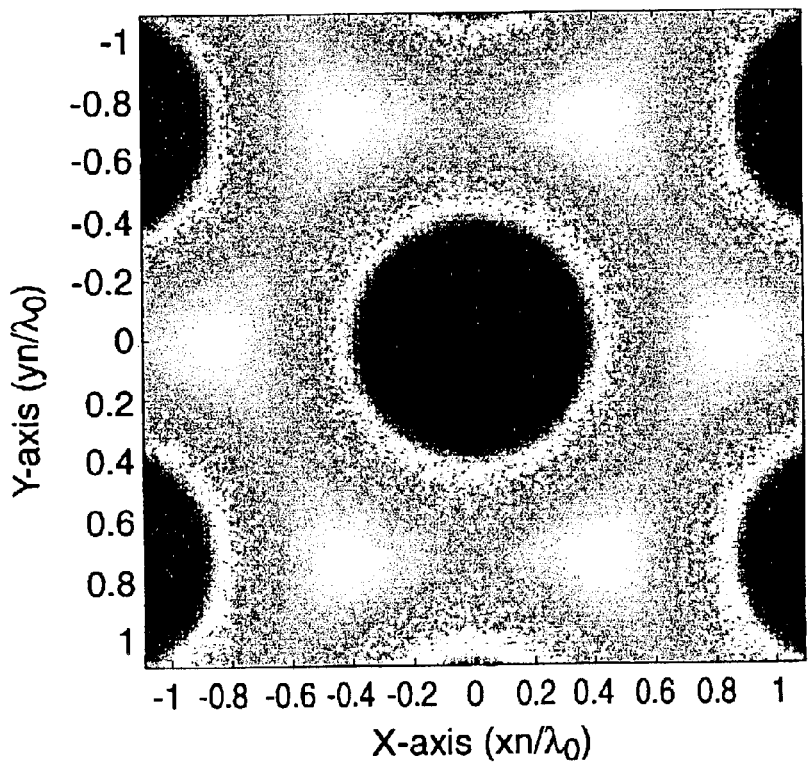
FIG. 19 provides a more detailed view of the interference pattern of FIG. 6.

FIGS. 14–15 plot the intensity on the x- and y-axis of the irradiation pattern on FIG. 12, while FIG. 16 provides a more detailed view of the interference pattern of FIG. 12. FIGS. 17–18 plot the intensity on the x- and y-axis of the irradiation pattern on FIG. 6, while FIG. 19 provides a more detailed view of the interference pattern of FIG. 6.

Figure 20:
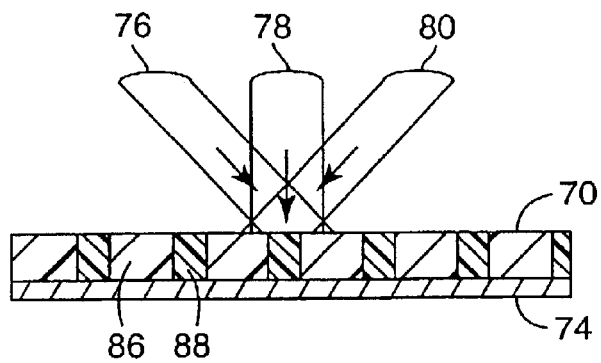
FIG. 20 is a cross-sectional view of a photopolymerizable resin material being exposed to an S-polarized three-beam interference pattern.
Figure 21:
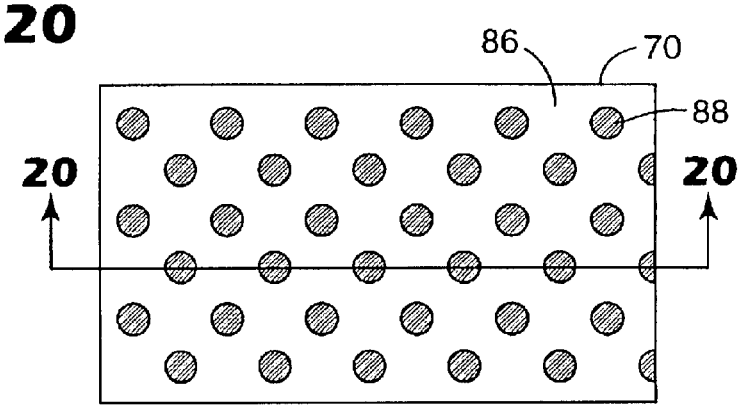
FIG. 21 is a top view of the three-beam interference pattern on the photopolymerizable resin of FIG. 20.

FIG. 20 shows a cross-sectional view of a photoreactive polymer 70 on a substrate 74 exposed to the interference pattern of three coherent light beams 76, 78, 80. In this example, the interference pattern is configured to include a cladding area 86 and core areas 88 in the photoreactive polymer 70. FIG. 21 shows a top view of the interference pattern of FIG. 20. In the particular interference pattern illustrated in FIGS. 20–21, the cladding area 86 is the bright area including the maxima of the interference pattern and the core areas 88 are the dark areas including the minima of the interference pattern. While many polarizations of the three coherent light beams 76, 78, 80 may be used to obtain an interference pattern similar to that illustrated in FIGS. 20–21, S-polarized light is preferred since it leads to maximum contrast and its irradiance pattern is insensitive to a variation of the polar angle.

Figure 22:
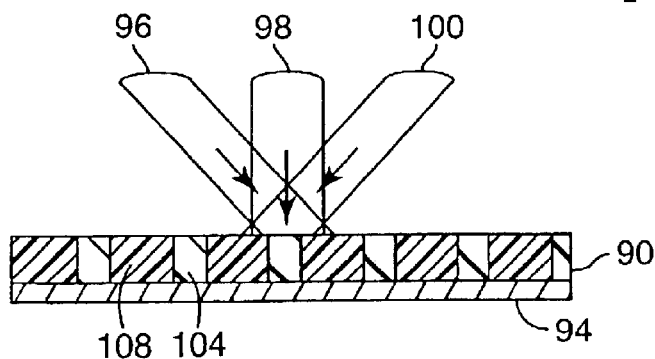
FIG. 22 is a cross-sectional view of a photopolymerizable resin material being exposed to a different three-beam interference pattern.
Figure 23:
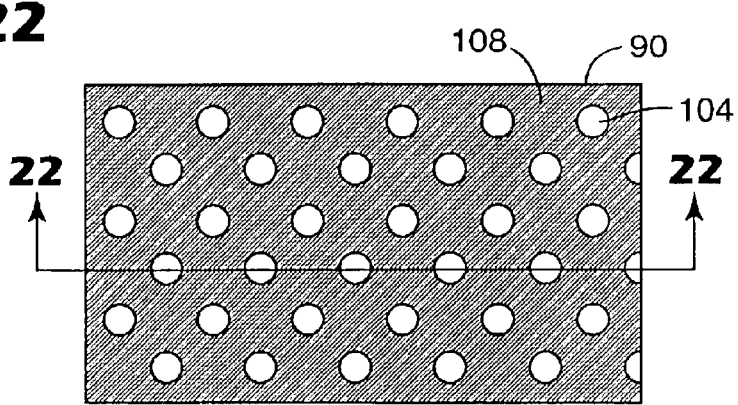
FIG. 23 is a top view of the three-beam interference pattern on the photopolymerizable resin of FIG. 22.

FIG. 22 shows a cross-sectional view of a photoreactive polymer 90 on a substrate 94 exposed to a different interference pattern of three coherent light beams 96, 98, 100. The interference pattern of FIG. 22 is different than the interference pattern of FIG. 20 because the three interfering beams 96, 98, 100 have different characteristics than the three interfering beams 76, 78, 80. The three interfering beams 96, 98, 100 are selected so that the interference pattern includes core areas 104 and a cladding area 108 in the photoreactive polymer 90. FIG. 23 shows a top view of the interference pattern of FIG. 22. In the particular interference pattern illustrated in FIGS. 22 and 23, the core areas 104 are the bright areas including the maxima of the interference pattern and the cladding area 108 is the dark area including the minima of the interference pattern. While many polarizations of the three coherent light beams 76, 78, 80 may be used to obtain the pattern shown in FIGS. 22–23, S-polarized light is preferred since it leads to maximal contrast and the irradiance profile shape is independent of the polar angle.

Figure 24:
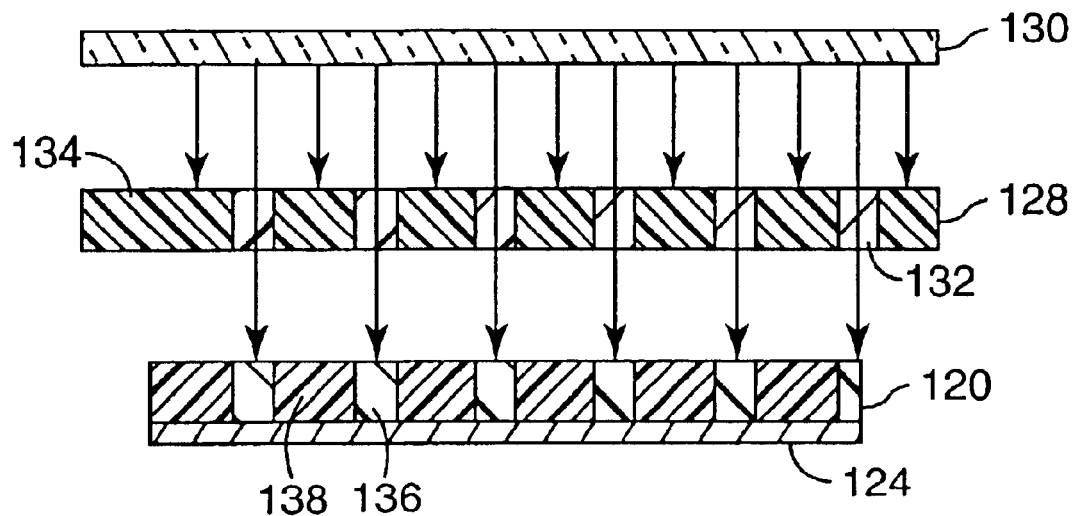
FIG. 24 is a cross-sectional view of a photoreactive polymer material being exposed to a light pattern using a mask.
Figure 25:
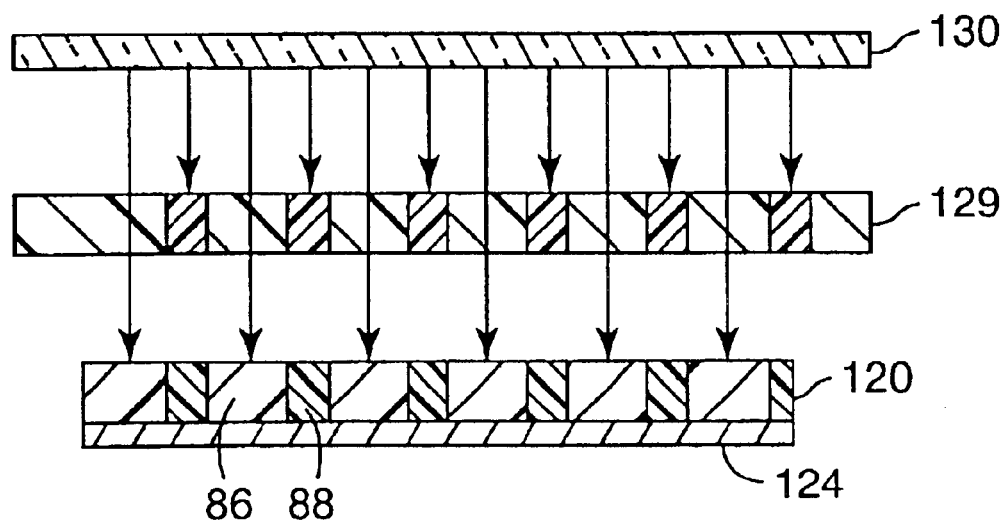
FIG. 25 is a cross-sectional view of a photoreactive polymer being exposed to a light pattern using a different mask.

Now referring to FIGS. 24–25, lithographic methods may also be used to form core areas and cladding areas for a FOFP using a photoreactive polymer film 120. First, optionally, a substrate 124 is baked or otherwise chemically prepared such that the surface is clean and free from embedded water vapor. Next the film 120 of photoreactive material is applied to the open face of the substrate 124. One example of a preferred photoreactive material is a negative photoresist such as SU-8, although other material including positive photoresists may be used also. The photoreactive material may be applied to the substrate in many different ways known in the art, such as either spin-casting or roll-bar methods. Optionally, a pre-exposure bake of the film 120 on the substrate 124 is performed. Then a mask is used with a light source 130 to expose the film 120.

FIG. 24 illustrates a mask 128 having a predetermined pattern. The mask 128 may have open areas 132 and a closed area 134. The top view of the mask 128 would be identical to the top view of the interference pattern shown in FIG. 23.

The portions of the film that are not covered by the mask are accordingly exposed to light during the exposure steps. With the mask 128 of FIG. 24, core areas 136 of the film 120 are exposed to light and the cladding area 138 is not exposed to light.

Alternatively, a different mask 129 shown in FIG. 25 could be used during the exposure step. The top view of mask 129 is similar to the appearance of the irradiance pattern shown in FIG. 21. With this type of mask, the cladding area 86 is exposed to light while the core areas 88 are not exposed to light. After the exposure step, some portions of the film will be solidified or polymerized, while other portions of the film will remain soluble to a developer solution, depending on whether a negative or positive photoresist film is used. In a developing step, a solvent is applied to the film to eliminate the shadow mask and the undeveloped photoreactive material. Then an optional post-developing bake may be performed.

One approach to forming a FOFP involves forming solid polymer core areas first using either lithographic or holographic techniques. Next the unsolidified cladding areas are eliminated. Optionally, the cladding area may then be back-filled in order to reach a particular NA. Solid polymer core areas may be formed in at least two ways with a holographic technique using either a positive or negative photoresist. Alternatively, a lithographic technique can be used to form the solid polymer cores.

Figure 26:
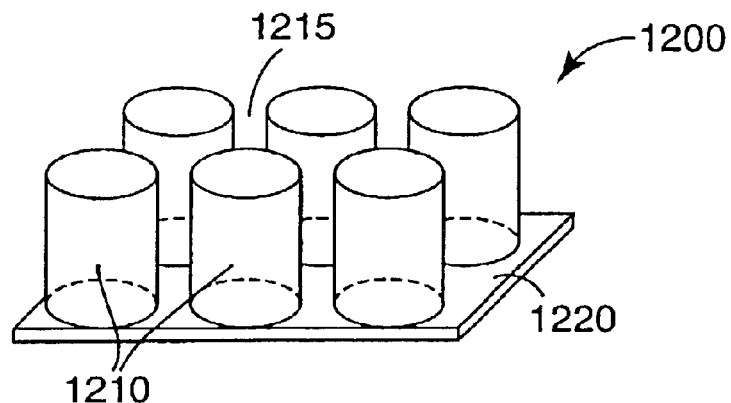
FIG. 26 is a perspective view of an optical plate including solid core areas of polymerized resin.

In one holographic technique, a positive photoresist could be used as the photoreactive polymer on the substrate and an interference pattern is created where the core areas are dark and the cladding areas are bright, similar to the interference pattern illustrated in FIGS. 20–21. Accordingly, the cladding area of the positive photoresist will undergo a photoreaction and will be soluble to a developer solution upon exposure to the interference pattern. The core areas that were not exposed to light are polymerized. The cladding area may be eliminated using a solvent such as ethanol. FIG. 26 shows the resulting core template 1200 having solid core areas 1210 surrounded by a void cladding area 1215 on a substrate 1220.

In another holographic technique for creating solid polymer cores, a negative photoresist is used and an interference pattern is created where the core areas are bright and the cladding areas are dark, similar to the interference pattern illustrated in FIGS. 22–23. As shown in FIG. 22, a photopolymerizable material 90 on a substrate 94 may be exposed to an interference pattern generated by three beams 96, 98, 100 where the core areas 104 are bright and the cladding areas 108 are dark. Where the photopolymerizable material 90 is a negative photoresist, the core areas will be polymerized upon exposure to the interference pattern while the cladding area will be unpolymerized. The cladding area may be eliminated using a solvent.

Using a lithographic technique as illustrated in FIG. 24, a mask 128 may be used in conjunction with a negative photoresist film to form solid core areas. The mask 128 causes the core areas 136 to be exposed to light while the cladding area 138 is not exposed to light. The core areas will be polymerized upon exposure to light passing through the mask 128.

In another lithographic technique, a positive photoresist could be used as the photoreactive polymer on the substrate and a mask is used to expose the photoreactive polymer in the cladding areas but not in the core areas as shown in FIG. 25. The mask 129 has covered core areas and open cladding areas similar to the appearance of the irradiance pattern shown in FIG. 21. With this type of mask, the cladding area is exposed to light while the core areas are not exposed to light. The cladding area therefore undergoes a photoreaction and will be soluble to a developer solution upon exposure to the interference pattern. The core areas that were not exposed to light are polymerized.

Once the core areas are polymerized using a lithographic or holographic technique, the non-polymerized photoreactive material in the cladding area can be eliminated. Ethanol or other solvents known in the art can be used to wash out the unpolymerized areas. FIG. 26 shows polymerized core areas 1210 on a substrate 1220 after the photoreactive material in the cladding area has been eliminated. A FOFP may simply have air as the cladding material. If the cladding area is air, careful handling is preferred to not disturb the polymer core areas. The void cladding area 1215 of FIG. 26 may be backfilled with a cladding material, resulting in the optical plate 1400 of FIG. 27, having a cladding area 1402 and core areas 1404 on a substrate 1406. The material used in the cladding area 1402 has an index of refraction lower than the core areas 1404.

In one preferred embodiment of the present invention, the light pattern used to form the solid core areas has core areas that are hexagonally symmetrical, as shown in FIGS. 21 and 23.

A FOFP may also be constructed by first forming a solid cladding structure with voids in the core areas and then optionally backfilling the core areas. A solid cladding with core voids may be formed using either a positive or negative photoresist. In one technique, a negative photoresist is used as the photoreactive polymer on the substrate and an irradiance pattern (either holographic or lithographic) is created where the core areas are dark and the cladding areas are bright, for example, as illustrated in FIGS. 20–21. Accordingly, the cladding areas of the negative photoresist are exposed to the bright portions of the irradiance pattern and solidify, polymerize, crosslink, or otherwise become less soluble in a developer. The core portions of the photoreactive material do not polymerize and remain soluble in a developer. The non-solidified negative photoresist material in the core areas is eliminated using ethanol or other solvents known in the art.

In the complementary technique, photoreactive material 90 on a substrate 94 is exposed to an irradiance pattern (holographic or lithographic) where the cladding area is dark and the core areas are bright. The irradiance pattern may be formed holographically by a three-beam interference pattern formed by light beams 96, 98 and 100 as shown in FIGS. 22–23. Alternatively, a shadowmask such as mask 128 in FIG. 24 may be used to create a dark cladding area 138 and bright core areas 132 on a film 120 of positive photoresist. The irradiance pattern (either holographic or lithographic) forms dark cladding areas 108 and bright core areas 104 as illustrated in FIG. 23. The positive photoresist in the core areas 104 undergoes a photoreaction so that it is soluble to a developer solution upon exposure to light in the bright patches of the irradiance pattern. Additional processing causes the positive photoresist material in the cladding areas to be polymerized. The non-polymerized core areas are eliminated from the optical plate by using ethanol or other solvents known in the art. The structure 1300 shown in FIG. 28 results, having a solid cladding area 1310 and void core areas 1320 on a substrate 1330.

Figure 27:
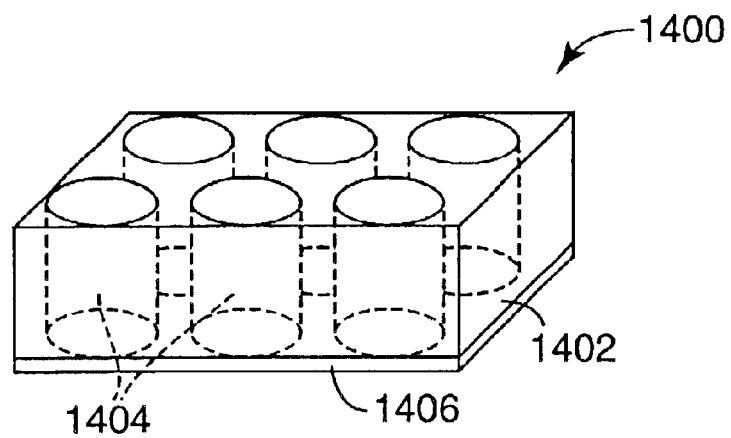
FIG. 27 is a perspective view of a FOFP equivalent structure where the optical plate of either FIG. 26 or FIG. 28 has been backfilled with a secondary polymer.

The columnar void areas 1320 within the cladding area 1310 may be filled with a material having an index of refraction higher than the cladding areas. Examples of material suitable for backfilling the columnar void areas 1320 include polymerizable materials, such as, for example, acrylates, methacrylates, vinyl and condensation monomers and their derivatives. If the columnar void areas 1320 are backfilled, the optical plate 1400 shown in FIG. 27 is the result, where the material in the cladding area 1402 has a lower index of refraction than the material in the core areas 1404. Alternatively, the cores may include a material with an index of refraction lower than the cladding areas, for example, the cores may be left unfilled, resulting in an optical device with air core areas.

Figure 28:
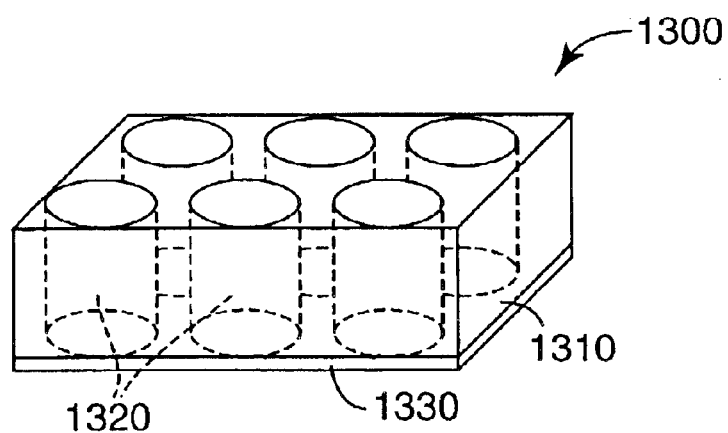
FIG. 28 is a perspective view of an optical plate including a solid cladding area of polymerized resin with hollow core areas.

Using either lithographic or holographic technique, the optical plate 1400 of FIG. 27, the optical plate 1300 of FIG. 28, or the optical plate 1200 of FIG. 26 may be constructed to have the optical qualities of a FOFP and therefore may serve as a FOFP equivalent. These structures may be positioned at many different locations in a display device near a liquid crystal layer to accomplish desired optical effects, such as azimuthal averaging.

Figure 29:
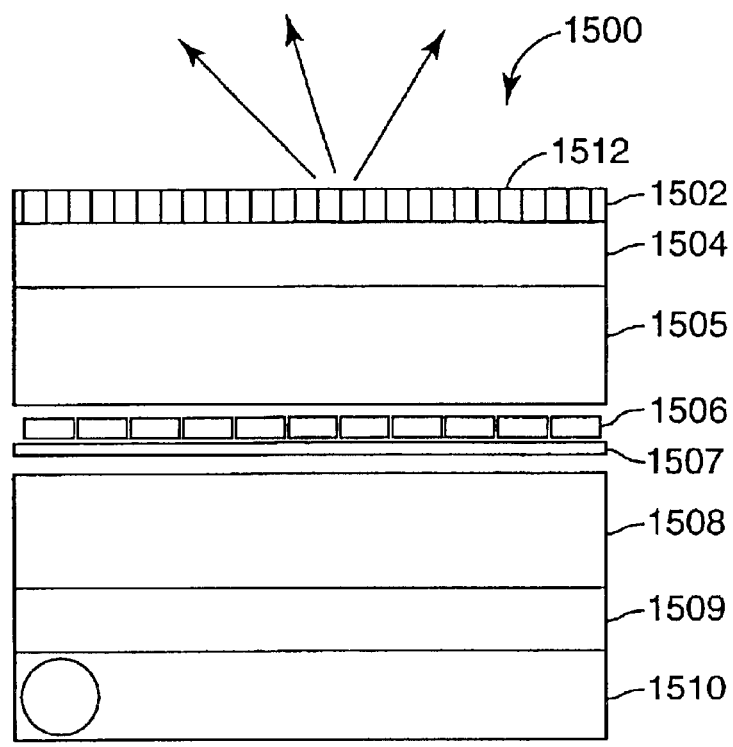
FIG. 29 is a side view of the FOFP of FIG. 27 in a display device.

A FOFP equivalent layer may be placed on top of a liquid crystal layer to reduce or eliminate undesirable variations in luminance, contrast ratio and chromaticity across a display device by providing azimuthal averaging. In addition, this placement of a FOFP allows color filters to be placed outside of the liquid crystal cell without or with decreased parallax problems. This type of FOFP placement is often referred to as a front FOFP. One example of a front FOFP is illustrated in FIG. 29, showing a cross sectional view of a display device 1500 including a FOFP equivalent 1502, a first polarizer 1504, a substrate 1505, color filter 1506, a liquid crystal layer 1507, a second substrate 1508, a second polarizer 1509, and an optical cavity or light source 1510. Many other components may be included in the display device 1500. The FOFP 1504 includes core areas 1512.

Figure 30:
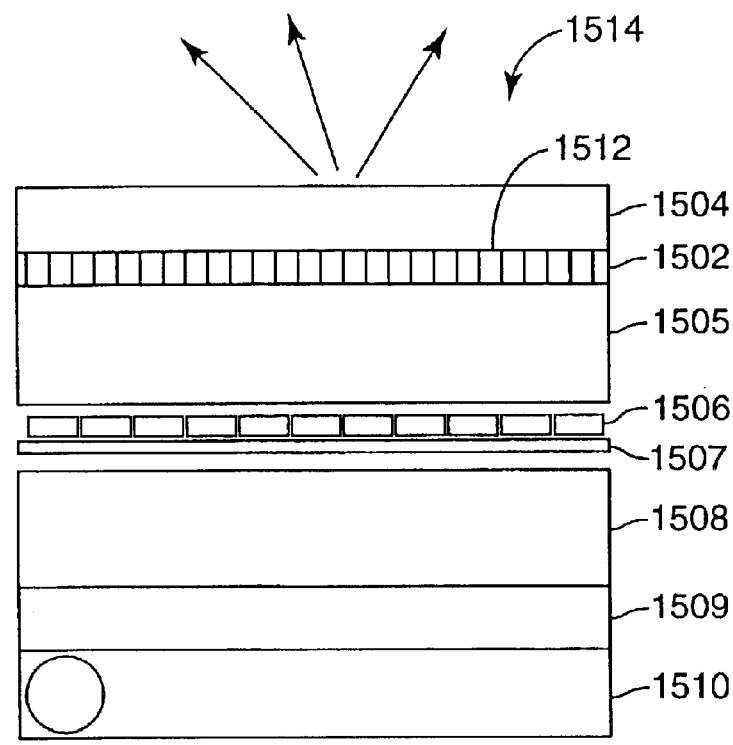
FIGS. 30–33 are side views of the FOFP of FIG. 27 in different positions within a display device.
Figure 31:
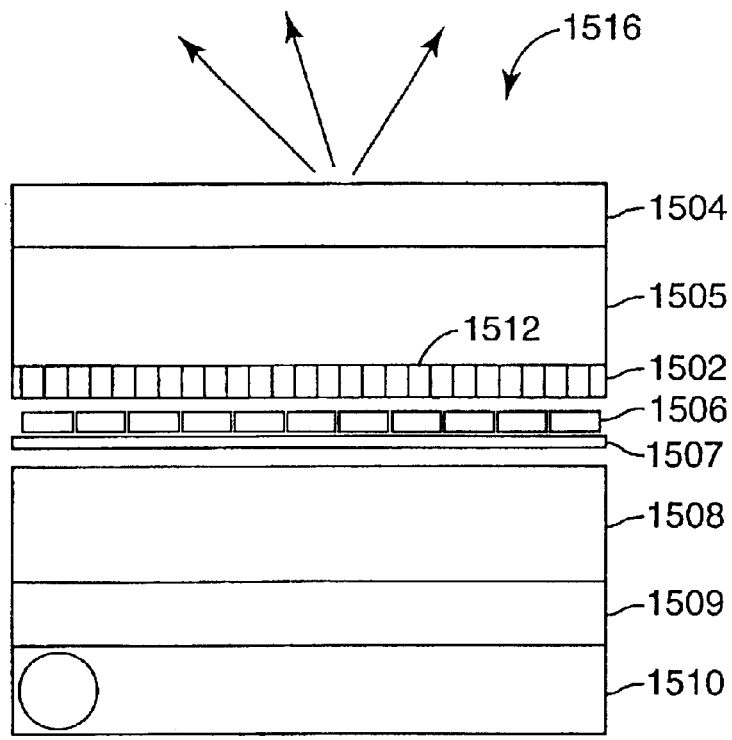
Figure 32:
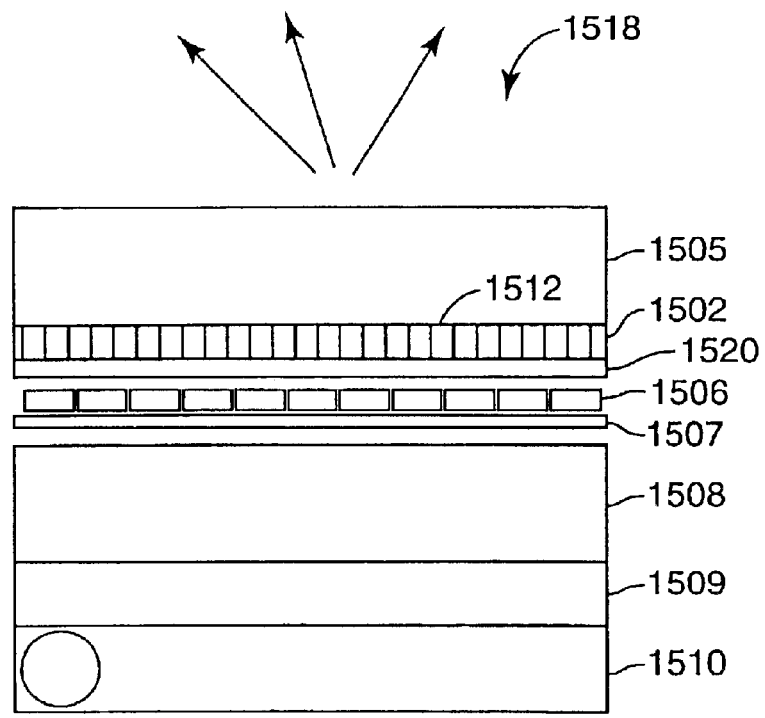

The front FOFP arrangements for the display devices shown in FIGS. 30–32 reduce the occurrence of a low-pass effect problem. A low-pass effect problem occurs where the higher spatial frequencies of the image get suppressed and the image appears as if it was smoothed, or as though an averaging filter was applied. The arrangements of FIGS. 30–32 result in improved sharpness and clarity of images.

Many other configurations of a display device using a front FOFP are possible, as illustrated in FIGS. 30–32, where reference numbers identical to reference numbers used in FIG. 29 are used to denote similar parts. FIG. 30 illustrates a display device 1514 that is similar to FIG. 29, except that the FOFP 1502 is applied to the display device on the substrate 1505 before the polarizer 1504. In FIG. 31, the display device 1516 includes a FOFP 1502 that is applied before the substrate, adjacent to the color filter layer 1506 and liquid crystal layer 1507. In FIG. 32, a display device 1518 includes a front FOFP 1502 that is applied in conjunction with a thin film polarizer 1520 adjacent to the liquid crystal 1507 and color filter layers 1506.

Back FOFP

Figure 33:
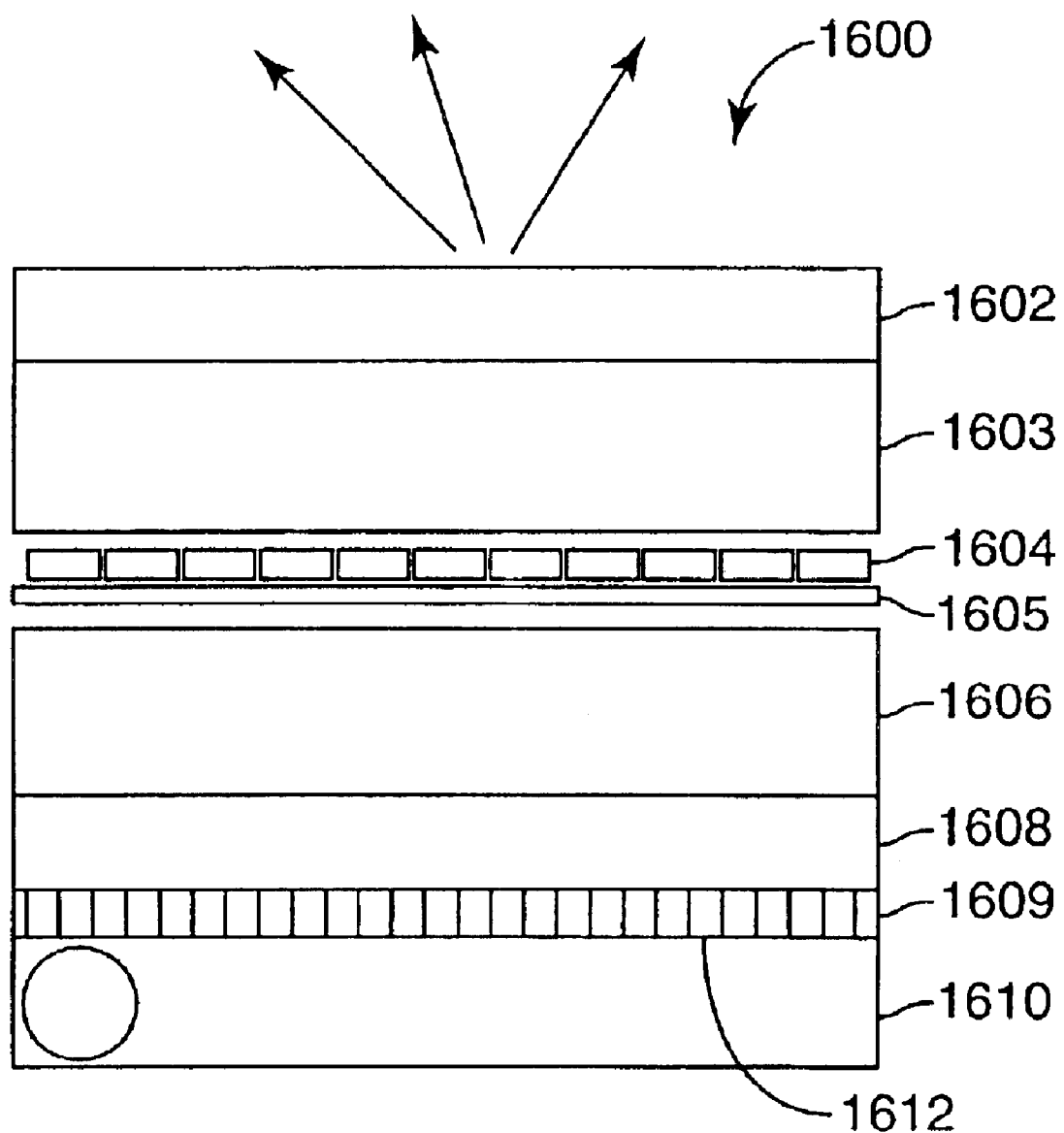

A so-called back FOFP placement in a display device is illustrated in FIG. 33, where the FOFP equivalent is underneath or behind the liquid crystal layer. The display device 1600 includes a first polarizer 1602, a substrate 1603, a color filter 1604, a liquid crystal layer 1605, a substrate 1606, a second polarizer 1608, a back FOFP 1609, and a backlight 1610. Many other components may be included in the display device 1600. The FOFP 1609 includes core areas 1612. A back FOFP placement may be constructed to act as a collimator. The index of the core and cladding, along with the index of the incident medium, determine the numerical aperture (NA). NA is the acceptance cone of angles for each fiber. Therefore, the index of the core, cladding and incident material can be chosen to provide a wide NA along the input side and a smaller NA on the output face, thereby causing the FOFP to act as a collimator. This allows light that propagates through the liquid crystal layer to be restricted to angles near the perpendicular, which prevents many of the off-axis contrast and color problems. The on-axis light is then thrown back off-axis as it passes through a front face FOFP, which could have a narrow input NA and a wide output NA. There are many other advantages of a collimating function in a back FOFP.

Figure 34:
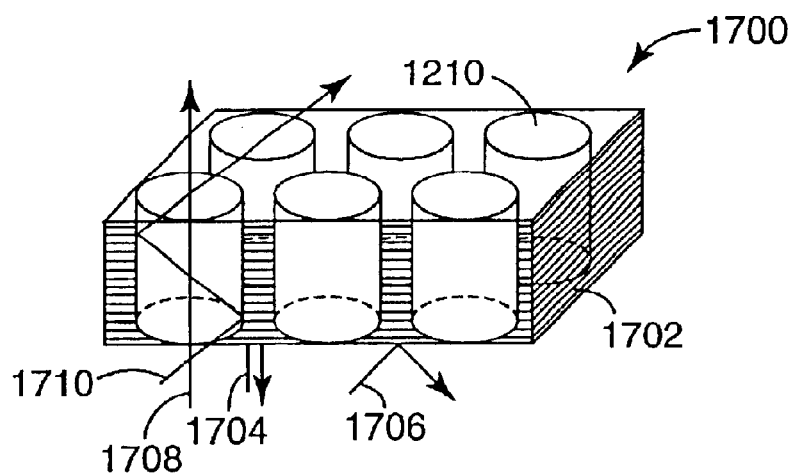
FIG. 34 is a perspective view of an optical plate including solid core areas with a cladding area comprised of a holographic Bragg grating.

The core and cladding templates of FIGS. 26 and 28 may also be used to construct holographic filters. In one example, the core template illustrated in FIG. 26 may have its void cladding area filled with a holographic photo polymer. The resulting optical plate 1700 is illustrated in FIG. 34 where the optical plate includes solid core areas 1210 formed from polymerized photoreactive material and holographic photo polymer 1702 in the cladding area. This structure is then exposed to several pairs of coherent beams to form reflection Bragg gratings. A holographic photo polymer is a material that reacts non-uniformly to a light interference pattern. Depending on the light exposure, different areas of the holographic photopolymer polymerize with different indices of refraction. Each of the three primary colors would require a separate two-beam holographic arrangement. This can be accomplished with either separate lasers (three lasers producing a total of six beams) or with one laser split into three angles of incidence. The three holographic exposures can also be simultaneous or subsequent, and would in both cases require some sort of shadow masking of the other primary colors.

In one example of a passive holographic filter shown in FIG. 34, the Bragg grating may be formed in such a way as to reflect light from the entire visible spectrum. As long as the resulting index of the entire Bragg grating is lower than the core index, the net result is a film that allows light only to pass through the core areas 1210. This will ensure azimuthal averaging while at the same time recycling the light that would have otherwise leaked into the cladding. The less light that gets in the cladding, the better the azimuthal averaging will be. In past FOFP structures, an absorptive material was often used for the cladding material to prevent leakage into the cladding. However, where the cladding material forms a Bragg grating, the light incident on the cladding can be recycled instead of being absorbed. Light rays 1704 and 1706 that are incident on the cladding material 1702 are reflected. In contrast, light rays 1708 and 1710 that are incident on the core areas 1210 are propagated through the core areas and are azimuthally averaged.

Figure 35:
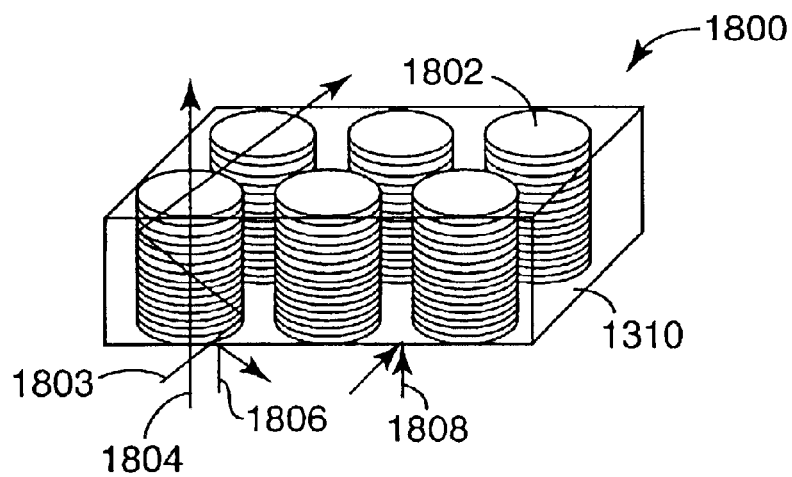
FIG. 35 is a perspective view of an optical plate including a solid cladding areas with core areas having a holographic Bragg grating.

In another example of the present invention, a cladding mode template such as that illustrated in FIG. 28 may be backfilled with holographic photo polymer to form the core areas. FIG. 35 illustrates a solid cladding area 1310 made of polymerized photoreactive material. The core areas in FIG. 35 have been filled with a holographic photo polymer 1802. The holographic photo polymer is exposed to several pairs of coherent beams to form a Bragg reflection grating as to allow only a certain band or bands of wavelengths to transmit while reflecting all others. In this way, the Bragg grating could be structured to allow only certain colors to be transmitted while at the same time azimuthally averaging due to the presence of the core cladding juncture. Light rays 1803 and 1804 having the desired wavelength are propagated by the core areas 1802. Light rays 1806 not having the desired wavelength are reflected by core areas 1802. The light that is reflected from the Bragg grating in the core areas 1802 may be recycled by the structure of the underlying display device. In this embodiment, the cladding material 1310 may be an absorbing material. Light rays 1808 incident on the cladding material 1310 will then be absorbed.

Holographic filters such as those described in relation to FIGS. 34 and 35 may be included in a display device either before or after the liquid crystal layer, depending upon the application and the desired optical effect.

The holographic filters of FIGS. 34 and 35 may be modified to provide switchable filters. Holographic polymer dispersed liquid crystal (H-PDLC) may be used as the holographic photopolymer in the filters of FIGS. 34 and 35. H-PDLC is a monomer that reacts non-uniformly to the interference pattern. Some examples of a H-PDLC are described in U.S. Pat. No. 6,398,981, which is incorporated by reference herein. H-PDLC is a miscible mixture of liquid crystal, monomer and photoinitiator. A diffusion process results involving all the species in the mixture. At the end of the process, polymer can be found primarily in the high intensity regions while the non-reactive components (liquid crystal, surfactants, etc.) reside in cavities located in the low intensity regions. Some liquid crystal remains trapped in the polymer binder and some polymer binder remains in the low intensity regions. Within the cavities, the liquid crystal molecules align parallel to an applied electric field. This alignment leads to a change in and even the extinction of the index modulation.

Figure 36:
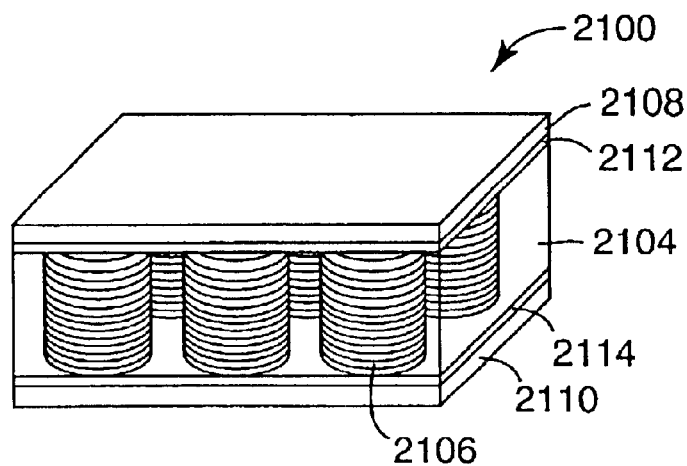
FIG. 36 is a perspective view of a switchable optical filter with core areas having a holographic Bragg grating.

A switchable reflective color film may be constructed by adding electrodes to a holographic filter similar to that shown in FIG. 35, as shown in FIG. 36. Optical device 2100 includes a polymer cladding area 2104 and core areas 2106 constructed of H-PDLC. The bottom substrate 2110 and the top layer 2108 both include electrodes 2114, 2112. The electrodes may be a layer of indium tin oxide (ITO) or other conductive material. The electrode is typically transparent for use with display devices. When an electrical field is applied to the filter, the liquid crystal molecules align, so that the H-PDLC material in the core areas 2106 permits all wavelengths of light to propagate. When the device is not powered, the core areas would allow light of a certain band of wavelengths to propagate while reflecting other wavelengths, as illustrated in FIG. 35. The Bragg matching condition determines the wavelengths that will propagate, as known in the art. The pitch or period of interference ($\Lambda$) and angle of incidence on the grating ($\pi/2$ for a waveguide) are related to the peak wavelength ($\lambda$) by the following equation:

$$\Lambda = \frac{\lambda}{2 \sin \theta}$$

The core areas 2106 could be constructed to reflect all wavelengths of light when no electric field is present, so that the optical device 2100 is a switchable FOFP.

Figure 37:
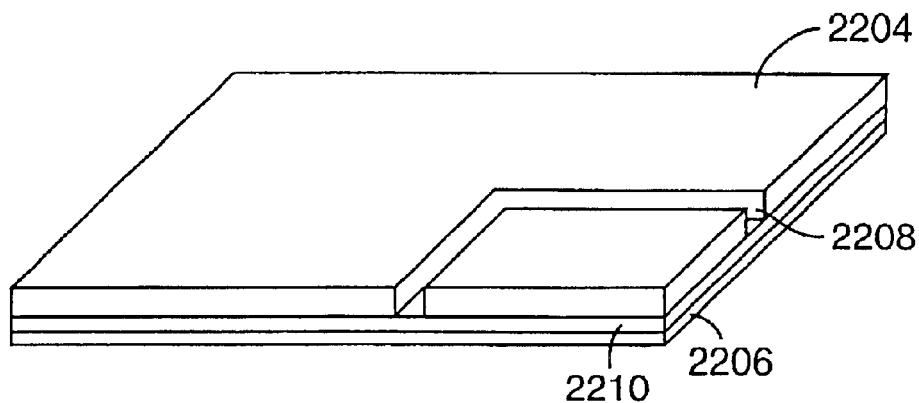
FIG. 37 is a perspective view of a right-angle waveguide template.
Figure 38:
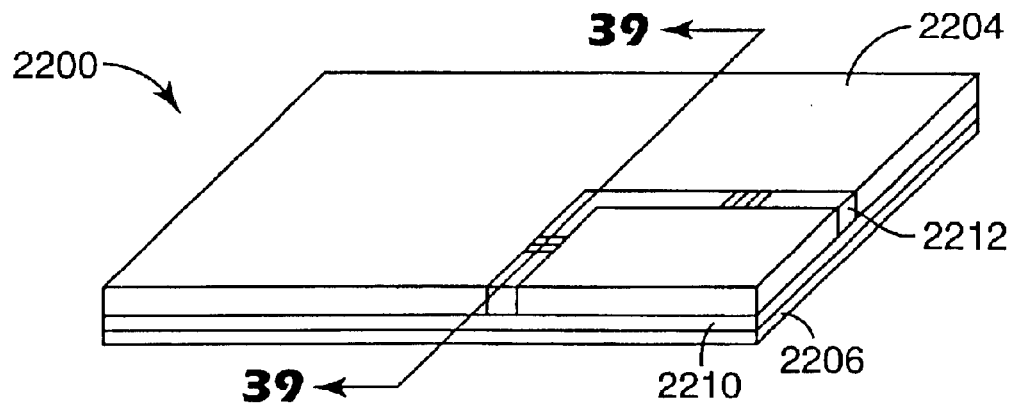
FIG. 38 is a perspective view of a right-angle waveguide.
Figure 39:
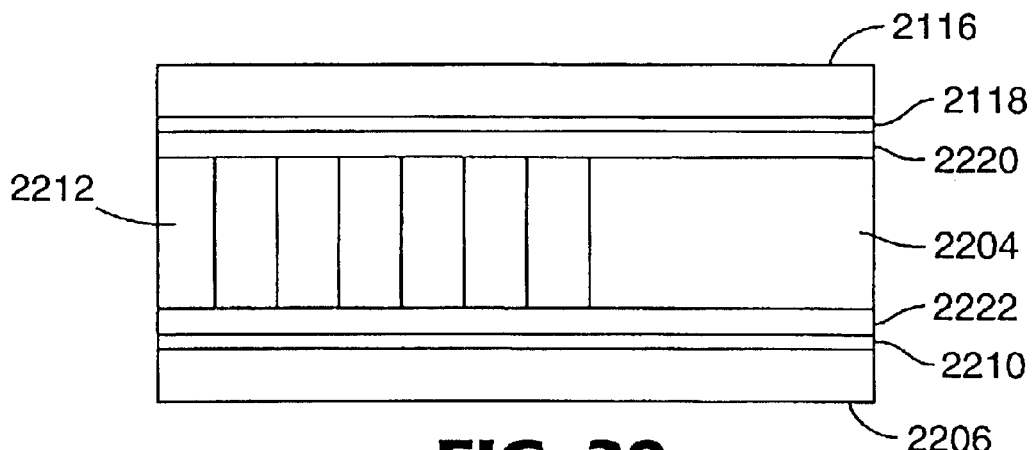
FIG. 39 is a cross-sectional view of a switchable right-angle waveguide template, including electrodes, along line 39—39 in FIG. 38.

In another embodiment of the invention, a polymer substrate may be formed to create optical waveguide channels. The waveguide could be tailored to steer light toward a certain space, for example, around a bend, turning at an angle, or along a tortuous path. An example of such a waveguide 2200 is illustrated in FIGS. 37–39. First, a polymer template 2204 is formed on a substrate 2206 using holography or masks to include a right angle void area 2208 for the waveguide channels. The formation of the polymer template 2204 may use a negative or positive photoresist, similar to the techniques for forming the core areas and cladding areas discussed above. Preferably, the substrate 2206 includes an electrode 2210. The void waveguide channel 2208 is then filled with H-PDLC material and subsequently exposed to a holographic grating or intensity grating in order to create a desired index modulation in the core of the waveguide, in the appropriate spot. The H-PDLC material forms a waveguide channel 2212

Alternatively, a multi-beam holographic exposure is used to form a birefringence core in the non-grating core areas.

A cross-sectional view of a waveguide device 2200 is shown in FIG. 39. A top layer 2216 including an electrode 2118 may also be included in the device 2200. Polymer layers 2220, 2222 may also be positioned between the electrodes and the waveguide channel structure. When an electrical field is applied to the H-PDLC material in the waveguide channel 2212, the variation in the index refraction may be modified or eliminated.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A display device comprising:
   an optical display element; and
   a polymer face plate that receives or directs light to the optical display element comprising columnar areas where an index of refraction of the columnar areas is different from the index of refraction of a cladding area surrounding the columnar areas, wherein the columnar areas are formed by exposure of a photoactive resin to a light interference pattern formed by three collimated and coherent light sources, wherein the light interference pattern includes first light regions and second dark regions in the photoactive resin wherein the photoactive resin of the first light region is altered by exposure to light of the light interference pattern and wherein either the first regions or the second regions form the columnar areas.

2. The display device of claim 1, the face plate further comprising a cladding material in the cladding area formed by photoactive resin of either the first or second region being altered to be solidified surrounding the columnar areas after exposure to the light interference pattern, wherein the columnar areas are void of material.

3. The display device of claim 2 wherein the columnar areas of the face plate further comprise a liquid crystal material that has been exposed to a plurality of coherent light sources to solidify the liquid crystal material, wherein the cladding area has an index of refraction that is less than an index of refraction of the columnar areas.

4. The display device claim 3 wherein the columnar areas have a variation in the index of refraction, wherein the face plate reflects some wavelengths of light.

5. The display device of claim 2 wherein the cladding area of the face plate absorbs light.

6. The display device of claim 1 wherein the columnar areas are void areas.

7. The display device of claim 6 wherein the index of refraction of the cladding material is non-uniform, wherein the face plate reflects substantially all wavelengths of visible light.

8. The display device of claim 1, wherein the columnar areas are substantially hexagonally symmetrical in a plane approximately parallel to a plane of the first substrate.

9. The display device of claim 1 wherein the columnar areas or the cladding area are void areas.

10. The display device of claim 1 wherein the cladding area is a void area.

11. The display device of claim 1 wherein columnar areas are solid columnar areas and the face plate further comprises:
    a cladding material in the cladding area surrounding the solid columnar areas, the cladding material formed by exposing a liquid crystal material to a plurality of coherent light sources to solidify the liquid crystal material, wherein the cladding material has an index of refraction that is less than an index of refraction of the columnar areas.

12. A method for forming a display device comprising:
    generating a face plate element by
    (i) providing a first substrate with a photoactive resin thereon;
    (ii) exposing the photoactive resin to a light interference pattern formed by three collimated and coherent light sources to generate, according to the light interference pattern, first light regions and second dark regions in the photoactive resin wherein the photoactive resin of the first light region is altered by exposure to light of the light interference pattern and wherein either the first regions or the second regions form columnar features; and
    combining the face plate with an optical display element to form a display device,
    wherein the face plate receives or directs light to the optical display element.

13. The method of claim 12 wherein after exposure to the light interference pattern, the photoactive resin of either the first or second region is altered to be solidified to form solid columnar features while the photoactive resin of either the first or second regions is soluble, further comprising the step of dissolving the photoactive resin that is soluble.

14. The method of claim 13 further comprising:
    filling a cladding area surrounding the solid columnar features with a liquid crystal material; and
    exposing the liquid crystal material in the cladding area to a plurality of coherent light sources to solidify the liquid crystal material,
    wherein the cladding area has an index of refraction that is less than an index of refraction of the columnar features.

15. The method of claim 14 wherein the plurality of coherent light sources are selected to cause a variation in the index of refraction in the liquid crystal material in the cladding area, wherein the resulting structure reflects substantially all wavelengths of visible light.

16. The method of claim 12 wherein after exposure to the light interference pattern, the photoactive resin of either the first or second region is altered to be solidified to form a solid cladding area surrounding the columnar features, while the photoactive resin in the columnar features is soluble, further comprising the step of dissolving the soluble photoactive resin in the columnar features.

17. The method of claim 16 further comprising:

filling the columnar features with a liquid crystal material; and exposing the liquid crystal material to a plurality of coherent light sources to solidify the liquid crystal material, wherein the cladding area has an index of refraction that is less than an index of refraction of the columnar features.

18. The method of claim 17 wherein the coherent light sources are selected to cause a variation in the index of refraction in the liquid crystal material in the columnar features, wherein the resulting structure reflects some wavelengths of light.

19. The method of claim 16 wherein the cladding area absorbs light.

20. The method of claim 12, wherein the columnar features are substantially hexagonally symmetrical in a plane approximately parallel to a plane of the first substrate.

21. A method of manufacturing a wave guide comprising:

providing a first substrate with a photoactive resin thereon;

creating a wave guide channel in a wave guide template comprising exposing the photoactive resin to a light pattern having a first light region and a second dark region, wherein after exposure to the light pattern, the photoactive resin of either the first or second region is altered to be solidified to form the wave guide template while the photoactive resin of either the first or second regions is soluble, further comprising the step of dissolving the photoactive resin that is soluble to define the wave guide channel in the wave guide template;

filling the wave guide channel of the wave guide template with a liquid crystal material;

exposing the liquid crystal material to a light grating to create a variation of an index of refraction of the liquid crystal material in the wave guide channel.

22. The method of manufacture of claim 21 wherein the first substrate includes an electrode and further comprising positioning a second substrate with a second electrode opposite the first substrate, so that the second and first electrodes contact the liquid crystal material in the wave guide channel, wherein when an electrical field is applied to the liquid crystal material in the wave guide channel, the variation in the index of refraction is modified.

23. The method of manufacture of claim 22 wherein when an electrical field is applied to the liquid crystal material in the wave guide channel, the variation in the index of refraction is eliminated.

24. The method of manufacture of claim 21 wherein the wave guide channel forms a right angle.

* * * * *

UNITED STATES PATENT AND TRADEMARK OFFICE
CERTIFICATE OF CORRECTION

PATENT NO. : 7,006,747 B2 Page 1 of 1
APPLICATION NO. : 10/346644
DATED : February 28, 2006
INVENTOR(S) : Michael J. Escuti It is certified that error appears in the above-identified patent and that said Letters Patent is hereby corrected as shown below:

On Page 2 of the Title Page, Col. 1, under (U.S. Patent Documents), line 6, delete "Kawata et al." and insert -- Kawata --, therefor.

On Page 2, Col. 1, under (Other Publications), line 3, delete "(Apr." and insert -- (Mar. --, therefor.

In Col. 2, line13, (Approx.) Delete " $\sqrt{N^2_{fib} - N^2_{clad}}$ " and insert -- $\sqrt{N^2_{fib} - N^2_{clad}}$ --, therefor.

In Col. 6, lines 27–28, delete "permittivitiy" and insert -- permittivity --, therefor.

In Col. 13, line 63, in Claim 4, after "device" insert -- of --.

In Col. 14, line 7, (Approx.)in Claim 8, delete "claim 1," and insert -- claim 1 --, therefor.

In Col. 15, line 17, (Approx.) iln Claim 20, delete "claim 12," and insert -- claim 12 --, therefor.

Signed and Sealed this

Seventeenth Day of October, 2006

JON W. DUDAS
*Director of the United States Patent and Trademark Office*